United States Patent
Takamine

(10) Patent No.: US 7,042,131 B2
(45) Date of Patent: May 9, 2006

(54) SURFACE ACOUSTIC WAVE DEVICE

(75) Inventor: Yuichi Takamine, Kanazawa (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 10/163,846

(22) Filed: Jun. 6, 2002

(65) Prior Publication Data

US 2002/0190815 A1 Dec. 19, 2002

(30) Foreign Application Priority Data

Jun. 6, 2001 (JP) .................................. 2001-171414
Apr. 2, 2002 (JP) .................................. 2002-100164

(51) Int. Cl.
*H01L 41/08* (2006.01)

(52) U.S. Cl. .................... 310/313 R; 29/25.35; 310/312; 310/313 A; 310/313 D; 333/155

(58) Field of Classification Search ........... 310/313 R, 310/313 B, 313 D; 333/193, 194, 1
See application file for complete search history.

(56) References Cited

U.S. PATENT DOCUMENTS

| | | | | |
|---|---|---|---|---|
| 3,952,268 A | * | 4/1976 | Schulz et al. | 333/155 |
| 3,965,444 A | * | 6/1976 | Willingham et al. | 333/155 |
| 4,342,012 A | * | 7/1982 | Inaba et al. | 333/155 |
| 4,484,098 A | * | 11/1984 | Cullen et al. | 310/313 A |
| 4,511,816 A | * | 4/1985 | Mikoshiba et al. | 310/313 A |
| 5,432,392 A | * | 7/1995 | Kadota et al. | 310/313 A |
| 6,291,923 B1 | | 9/2001 | Kadota | |

FOREIGN PATENT DOCUMENTS

| | | |
|---|---|---|
| DE | 199 00 628 | 8/1999 |
| EP | 0 034 351 | 8/1981 |
| EP | 0353073 A2 * | 1/1990 |
| EP | 0 682 410 | 11/1995 |
| EP | 0734120 A1 * | 5/2000 |
| EP | 1 081 853 | 3/2001 |
| JP | 2-37815 | 2/1990 |
| JP | 2000-196409 | 7/2000 |
| JP | 2000-332563 | 11/2000 |

OTHER PUBLICATIONS

Notice on Office Action from Chinese Patent Office Patent Office dated Nov. 12, 2004, (along with English translation).
Official Communication from Japanese Patent Office dated Aug. 30, 2005, issued in corresponding Japanese Patent Application No. 2002–100164.

* cited by examiner

*Primary Examiner*—Mark Budd
(74) *Attorney, Agent, or Firm*—Keating & Bennett, LLP

(57) ABSTRACT

A surface acoustic wave device includes, on a piezoelectric substrate, at least one surface acoustic wave filter and at least one surface acoustic wave resonator that is connected in series and/or parallel to the surface acoustic wave filter. A film having a positive frequency-temperature characteristic is disposed so as to cover at least one of the at least one surface acoustic wave resonator, except for a region in which the surface acoustic wave filter is provided.

22 Claims, 17 Drawing Sheets

SURFACE ACOUSTIC WAVE DEVICE

BACKGROUND OF THE INVENTION

1. Field of the Invention

The present invention relates to surface acoustic wave devices having a configuration in which a surface acoustic wave filter and a surface acoustic wave resonator are interconnected. More specifically, the present invention relates to a surface acoustic wave device having a configuration in which a film having a positive frequency-temperature characteristic is disposed on a piezoelectric substrate and also relates to a method for adjusting the frequency thereof.

2. Description of the Related Art

In recent years, in conjunction with an increase in subscribers and diversification of services, systems having wide transmission and reception bands and having transmission and reception frequency bands that are close to each other have been increasing. Correspondingly, there has been great demand for a bandpass filter having a broader passband and a greater attenuation in close proximity to the passband.

Surface acoustic wave filters (herein after simply referred to as "SAW filters") have been widely used as RF filters for portable telephones. Such a SAW filter uses a 36° to 44° Y-cut X-propagating $LiTaO_3$ substrate having a large electromechanical coefficient to realize a broad band. However, a 36° to 44° Y-cut X-propagating $LiTaO_3$ substrate has a frequency-temperature dependency of as much as −30 ppm/° C. to −35 ppm/° C. Thus, with a SAW filter including the substrate, a greater tolerance relative to a temperature change must be provided. Consequently, it has been difficult to increase the attenuation in close proximity to the passband.

As a method for compensating for the frequency-temperature characteristic of a 36° to 44° Y-cut X-propagating $LiTaO_3$ substrate, Japanese Unexamined Patent Application Publication No. 2-037815 proposes a method in which an Al electrode is formed on the substrate and then an $SiO_2$ film is further deposited thereon. In this publication, an $SiO_2$ film having a positive temperature coefficient is formed on a 36° to 44° Y-cut X-propagating $LiTaO_3$ substrate having a negative temperature coefficient, thereby reducing the absolute value of the temperature coefficient.

Deposition of $SiO_2$ film, however, causes a problem in that the propagation loss of the SAW filter is increased and thus, the electromechanical coefficient is reduced.

FIG. 16 shows the frequency characteristic of an exemplary longitudinally-coupled three-IDT-type resonator filter of the related art which is formed on a 36° Y-cut X-propagating $LiTaO_3$ substrate. In FIG. 16, the "characteristic represented on an enlarged scale" indicates a characteristic that is plotted against the large scale given at the right side of the vertical axis. FIG. 17 shows a frequency characteristic when an $SiO_2$ film is deposited so as to have a thickness equal to 15% of the wavelength that is defined by the pitch of the electrode fingers.

As is apparent from the comparison between FIGS. 16 and 17, the passband of the filter has a significant depression at the center, since the propagation loss deteriorates due to the formation of the $SiO_2$ film, the in-band insertion loss considerably deteriorates, and the electromechanical coefficient becomes small.

The deterioration of insertion loss due to the formation of the $SiO_2$ film as described above becomes more significant as the center frequency of the filter is increased. Thus, at frequencies at which the filter is used as an RF filter for a portable telephone, the in-band insertion loss thereof is deteriorated to such a degree that the filter cannot be used.

In addition, since the electromechanical coefficient becomes small, it has been difficult to broaden the bandwidth of the filter. Thus, in the art of RF filters, it has been difficult to use methods intended for improving a frequency-temperature characteristic by forming a $SiO_2$ film.

SUMMARY OF THE INVENTION

To overcome the problems with the related art described above, preferred embodiments of the present invention provide a SAW device that improves a frequency-temperature characteristic by forming a film having a positive frequency-temperature characteristic, that prevents deterioration of an in-band insertion loss, and that achieves a broad band.

According to a first preferred embodiment of the present invention, a SAW device includes a piezoelectric substrate having a negative frequency-temperature characteristic, at least one SAW filter provided on the piezoelectric substrate, and at least one one-terminal-pair SAW resonator that is provided on the piezoelectric substrate and that is connected in series and/or parallel to the SAW filter. The SAW device further includes at least one film that has a positive frequency-temperature characteristic and that is disposed so as to cover the at least one one-terminal-pair SAW resonator except for a region in which the SAW filter is provided. The film has a positive temperature coefficient, and thus, as the piezoelectric substrate, a piezoelectric substrate having a negative temperature coefficient is preferably used. Thus, the frequency-temperature characteristic in close proximity to the higher and lower sides of the passband of the SAW device exhibits a frequency-temperature characteristic that is substantially intermediate between frequency-temperature characteristics of the SAW filter and the one-terminal-pair SAW resonator connected in series and/or parallel thereto. This improves the frequency-temperature characteristic of the entire SAW device. In addition, since no film is formed on the SAW filter itself, considerable deterioration of the propagation loss and a reduction in the electromechanical coefficient are prevented.

Thus, in the past, an $SiO_2$ film was formed on the entire surface of a SAW filter for improving the temperature characteristic. However, there is a problem with this method in that the electromechanical coefficient becomes small.

In contrast, the first preferred embodiment of the present invention can provide sufficient attenuation by connecting the one-terminal-pair SAW resonator to the SAW filter. In addition, the film having a certain frequency-temperature characteristic is disposed on only the SAW resonator, so that the temperature characteristic is greatly improved. That is, the temperature characteristic is improved while the filter characteristic is maintained. Thus, the first preferred embodiment of the present invention can provide a SAW device having a broad band and having an excellent frequency-temperature characteristic without inducing deterioration of the in-band insertion loss.

Preferably, the film is disposed so as to cover the at least one one-terminal-pair SAW resonator that is connected in series to the SAW filter, and the anti-resonant frequency of the at least one one-terminal-pair SAW resonator is located in an attenuation zone at the higher side of the passband of the SAW filter. Thus, the frequency-temperature characteristic at the higher side of the passband is greatly improved. This arrangement, therefore, can provide a SAW device having a broad band and having an excellent frequency-temperature characteristic at the higher side of the passband without inducing considerable deterioration of the in-band insertion loss.

Preferably, the film is disposed so as to cover the at least one one-terminal-pair SAW resonator that is connected in parallel to the SAW filter, and the resonant frequency of the at least one one-terminal-pair SAW resonator is located in an attenuation zone at the lower side of the passband of the SAW filter. Thus, the frequency-temperature characteristic at the lower side of the passband is greatly improved. This arrangement, therefore, can provide a SAW device having a broad band and having an excellent frequency-temperature characteristic at the lower side of the passband while preventing considerable deterioration of the in-band insertion loss.

Preferably, the film is disposed so as to cover at least one one-terminal-pair SAW resonator that is connected in series to the SAW filter, and the anti-resonant frequency of the one-terminal-pair SAW resonator is located in an attenuation zone at the higher side of the passband of the SAW filter. In addition, preferably, the film is disposed so as to cover at least one one-terminal-pair SAW resonator that is connected in parallel to the SAW filter, and the resonant frequency of the one-terminal-pair SAW resonator that is connected in parallel to the SAW filter is located in an attenuation zone at the lower side of the passband of the SAW filter. With this arrangement, the frequency characteristic at the higher and lower sides of the passband is greatly improved. This arrangement, therefore, can provide a SAW device having a broad band and having an excellent frequency-temperature characteristic over the entire range of the passband without inducing considerable deterioration of the in-band insertion loss.

According to a second preferred embodiment of the present invention, a SAW device includes a piezoelectric substrate, at least one SAW filter provided on the piezoelectric substrate, and at least one one-terminal-pair SAW resonator that is provided on the piezoelectric substrate and that is connected in series and/or parallel to the SAW filter. The SAW device further includes at least one first film disposed so as to cover the at least one one-terminal-pair SAW resonator, the first film having a positive frequency-temperature characteristic, and a second film disposed so as to cover the SAW filter, the second film having a positive frequency-temperature characteristic. The thickness of the second film is preferably smaller than the thickness of the first film. In the second preferred embodiment of the present invention, since the at least one SAW resonator is coated with the first film, a sufficient attenuation is provided due to the load of the SAW resonator and the temperature characteristic is improved due to the first film. Since the first film is included and arranged as described above, it is possible to provide a SAW device that has a broad band and that achieves a satisfactory frequency-temperature characteristic at the lower or higher sides of the passband while preventing considerable deterioration of the in-band insertion loss. In this case, since the second film covers the SAW filter, it is possible to protect the SAW filter against metal powder or other such material or debris.

Preferably, the first film is disposed so as to cover the at least one one-terminal-pair SAW resonator that is connected in series to the SAW filter, and the anti-resonant frequency of the one-terminal-pair SAW resonator is located in an attenuation zone at the higher side of the passband of the SAW filter. Thus, the frequency-temperature characteristic at the higher side of the passband is greatly improved. This arrangement, therefore, can provide a SAW device having a broad band and having an excellent frequency-temperature characteristic at the higher side of the passband while preventing considerable deterioration of the in-band insertion loss.

Preferably, the first film is disposed so as to cover the at least one one-terminal-pair SAW resonator that is connected in parallel to the SAW filter, and the resonant frequency of the one-terminal-pair SAW resonator is located in an attenuation zone at the lower side of the passband of the SAW filter. Thus, the frequency-temperature characteristic at the lower side of the passband can be improved. This arrangement, therefore, can provide a SAW device having a broad band and having an excellent frequency-temperature characteristic at the lower side of the passband without inducing considerable deterioration of the in-band insertion loss.

Preferably, the first film is disposed so as to cover at least one one-terminal-pair SAW resonator that is connected in series to the SAW filter, and the anti-resonant frequency of the one-terminal-pair SAW resonator is located in an attenuation zone at the higher side of the passband of the SAW filter. In addition, preferably, the first film is disposed so as to cover at least one one-terminal-pair SAW resonator that is connected in parallel to the SAW filter, and the resonant frequency of the one-terminal-pair SAW resonator that is connected in parallel to the SAW filter is located in an attenuation zone at the lower side of the passband of the SAW filter. With this arrangement, the frequency characteristic at the higher and lower sides of the passband is greatly improved. This arrangement, therefore, can provide a SAW device having a broad band and having an excellent frequency-temperature characteristic over the entire range of the passband while preventing considerable deterioration of the in-band insertion loss.

In various preferred embodiments of the present invention, a silicon oxide film or a silicon nitride film is preferably used as the film having the positive frequency-temperature characteristic, and more preferably a $SiO_2$ film is used.

As the piezoelectric substrate in preferred embodiments of the present invention, a 36° to 44° Y-cut X-propagating $LiTaO_3$ substrate is preferably used. In this case, the 36° to 44° Y-cut X-propagating $LiTaO_3$ substrate preferably has a negative frequency-temperature characteristic, such that the formation of the film having a frequency-temperature characteristic improves the frequency-temperature characteristic. The present invention, therefore, can provide a SAW device having a broad band and having an excellent frequency-temperature characteristic.

According to a third preferred embodiment of the present invention, a method for adjusting the frequency of a SAW device configured according to other preferred embodiments of the present invention described above, includes the step of etching a portion of the film having the positive frequency-temperature characteristic in the at least one one-terminal-pair resonator on which the film is formed, so as to adjust the frequency. With this method, the frequency can be easily adjusted by etching a portion of the film having the positive frequency-temperature characteristic from the at least one one-terminal-pair resonator on which the film is formed. This method facilitates the provision of a SAW device having a desired band.

Other features, elements, characteristics and advantages of the present invention will become more apparent from the following detailed description of preferred embodiments thereof with reference to the attached drawings.

DETAILED DESCRIPTION OF PREFERRED EMBODIMENTS

The present invention will be more apparent from the following description with reference to specific preferred embodiments thereof.

Figure 1:
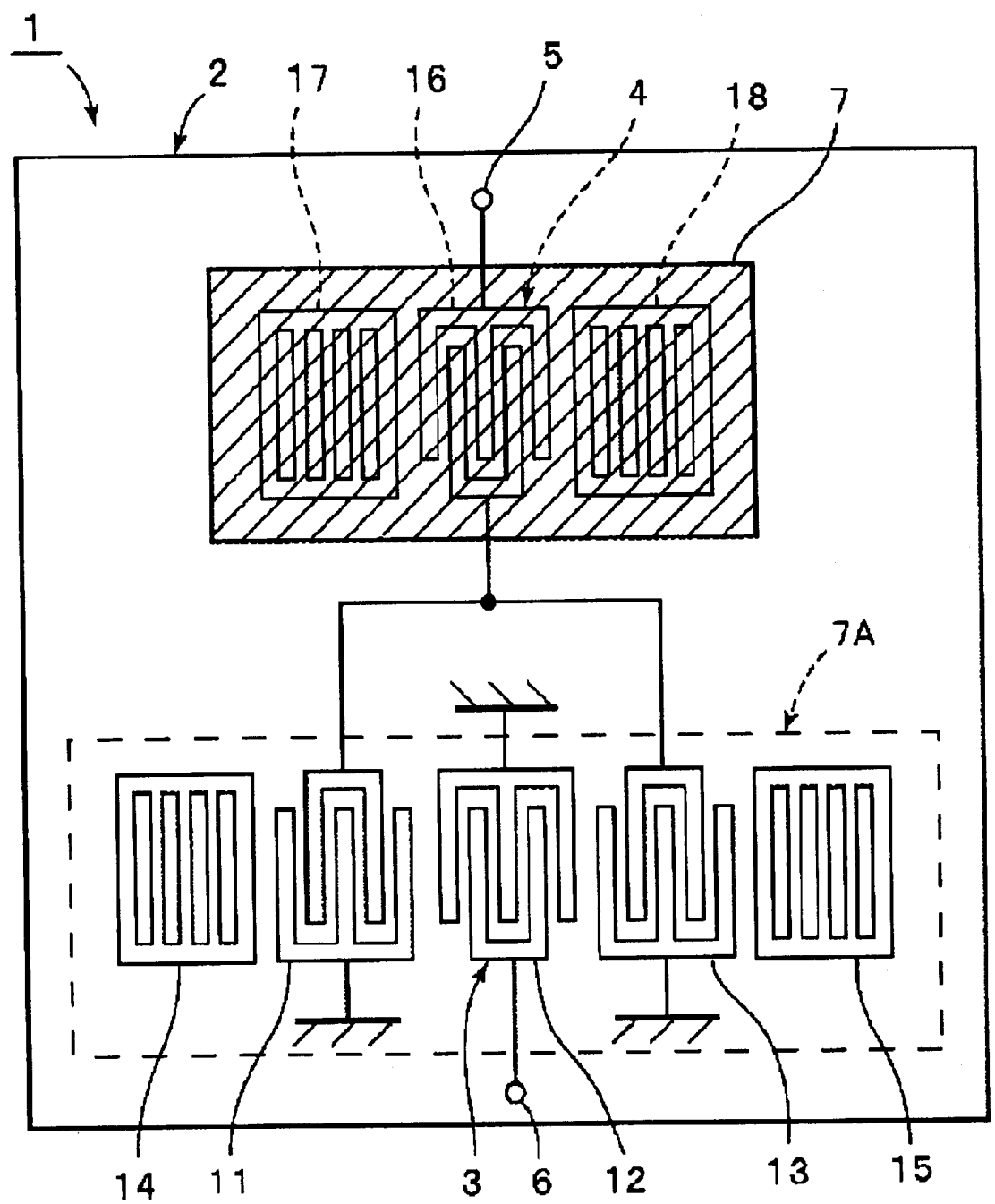
FIG. 1 is a schematic plan view of a SAW device according to a first preferred embodiment of the present invention.

FIG. 1 is a schematic plan view of a SAW device according to a first preferred embodiment of the present invention. A SAW device 1 according to this preferred embodiment preferably has a 36° Y-cut X-propagating LiTaO$_3$ piezoelectric substrate 2.

A three-IDT-type SAW filter 3 and a one-terminal-pair SAW resonator 4 are preferably formed of Al electrodes on the piezoelectric substrate 2.

The film thickness of the Al electrodes is preferably about 8% of the wavelength that is defined by the pitch of the electrode fingers, but an optimal value for the film thickness varies depending on a frequency and a required bandwidth.

The SAW filter 3 includes a group of three IDTs 11 to 13 arranged along the direction in which the SAW propagates and reflectors 14 and 15 arranged at two opposing ends of the group of the IDTs 11 to 13. That is, the SAW filter 3 is configured as a longitudinally-coupled three-IDT-type SAW resonator filter. In the present invention, however, the SAW filter 3 is not limited to the longitudinally-coupled three-IDT-type SAW resonator filter, and a filter having a different structure may also be used.

The one-terminal-pair SAW resonator 4 has an IDT 16 and reflectors 17 and 18 arranged at two opposing ends of the IDT 16. The reflectors 17 and 18, however, do not necessarily have to be provided.

One end of the IDT 11 and one end of the IDT 13 are interconnected and are also connected to one end of the IDT 16 of the one-terminal-pair SAW resonator 4. The other end of the IDT 16 of the one-terminal-pair SAW resonator 4 is connected to an input terminal 5. One end of the IDT 12 is connected to an output terminal 6. The other end of the IDT 12 is connected to ground potential. Each end of the IDTs 11 and 13 which is opposite to the ends connected to the IDT 16 is connected to a ground potential.

That is, the one-terminal-pair SAW resonator 4 is connected in series to the SAW filter 3.

A SiO$_2$ film 7 is disposed so as to cover the one-terminal-pair SAW resonator 4.

That is, in the preferred embodiment, the SiO$_2$ film 7 is formed on the piezoelectric substrate 2 so as to cover a region in which at least the one-terminal-pair SAW resonator 4 is provided, except for a region in which the SAW filter 3 is provided. The thickness of the SiO$_2$ film 7 is preferably about 15% of the wavelength defined by the pitch of the electrode fingers of the one-terminal-pair SAW resonator 4. The optimal value for the thickness of the SiO$_2$ film 7, however, varies depending on the structures of the SAW filter 3 and the one-terminal-pair SAW resonator 4 as well as the thickness of the underlying Al electrode films.

In this preferred embodiment, the SiO$_2$ film 7 is preferably formed as follows. The SAW filter 3 and the one-terminal-pair SAW resonator 4 are preferably formed of Al electrode films on the piezoelectric substrate 2, and then a SiO$_2$ film is formed by sputtering on the entire surface of the resulting structure. Any apparatus may be used for the sputtering, but an ECR (electron cyclotron resonance) sputtering apparatus is preferably used. Thereafter, the region in which the one-terminal-pair SAW resonator 4 is provided is coated with a resist, the SiO$_2$ film other than the region coated with the resist is removed by etching, and then the resist is removed.

A method for forming the SiO$_2$ film 7 is not limited to what is described above, and thus various methods can be used, such as a method using CVD (chemical vapor deposition) or a method using a lift-off process for removing the unwanted SiO$_2$ film instead of using etching.

In addition, removal of an unwanted amount of the SiO₂ film 7 on the one-terminal-pair SAW resonator 4 as needed by dry etching can adjust the frequency of the one-terminal-pair SAW resonator 4. The etching process performed for the frequency adjustment may be wet etching. Such a frequency adjustment allows for a significant reduction in the percentage of defective SAW devices 1.

Figure 2:
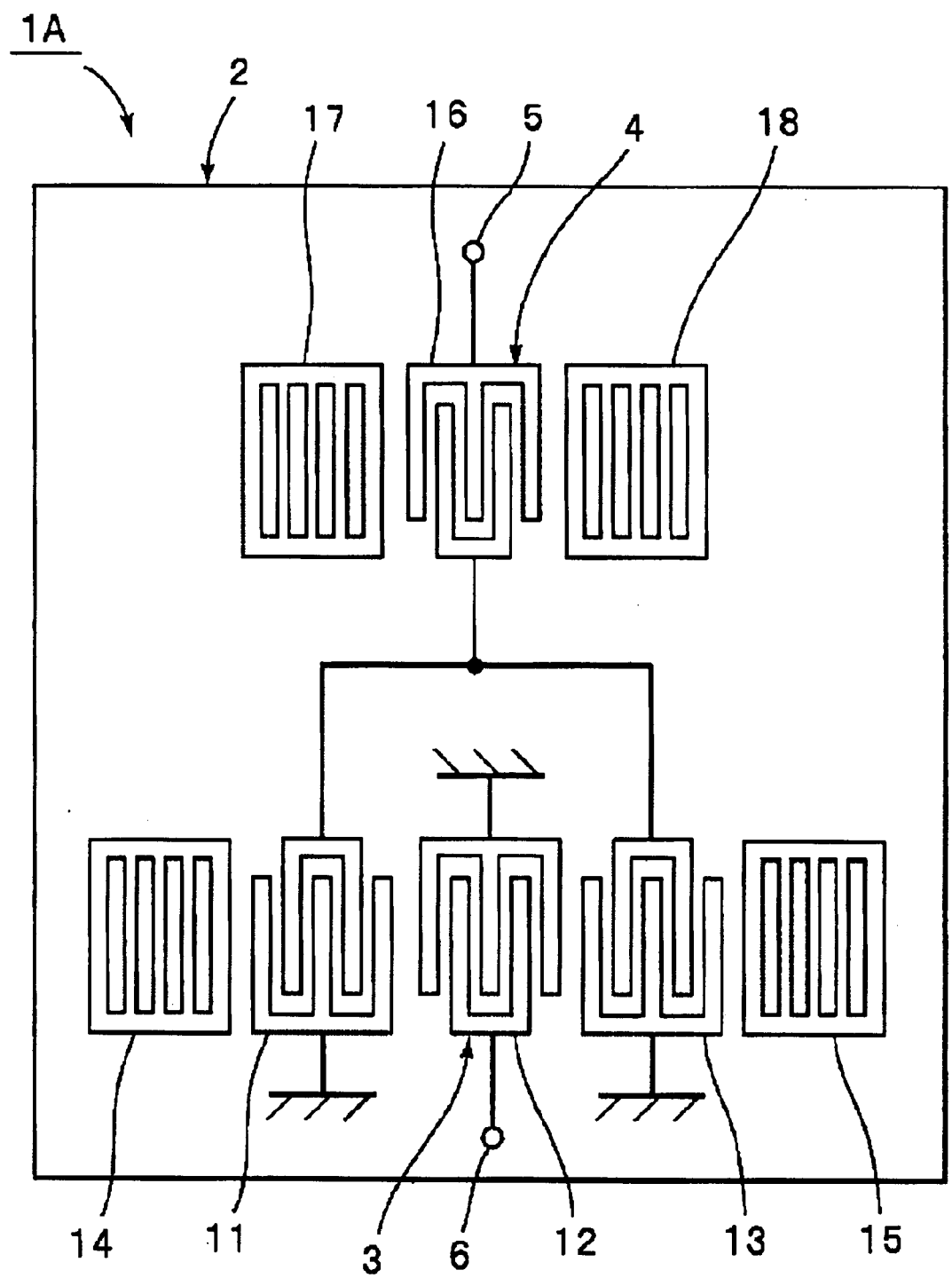
FIG. 2 is a schematic plan view of a SAW device of a first comparative example, in which an SiO$_2$ film is not formed so as to cover a one-terminal-pair SAW resonator.

In order to confirm the advantage of the SAW device 1 configured in accordance with the preferred embodiment described above, a SAW device 1A, shown in FIG. 2, of a first comparative example was prepared. The SAW device 1A was configured in the same manner as the first preferred embodiment, except that the SiO₂ film 7 was not formed. The frequency characteristics of the SAW device 1 and 1A were then measured. In this case, the specifications of the SAW filter 3 and the one-terminal-pair SAW resonator 4 were configured as follows.

With respect to the SAW filter 3, the pitch of the electrode fingers of the IDTs 11 to 13 was about 1.02 μm, the numbers of pairs of the electrode fingers of the IDTs 11, 12 and 13 were approximately 13.5, 20.5, and 13.5, respectively, and the number of electrode fingers of the reflectors 14 and 15 was 100. With respect to the one-terminal-pair SAW resonator 4, the pitch of the electrode fingers of the IDT 16 was about 0.96 μm, the number of pairs of the electrode fingers was 150, and the number of the electrode fingers of the reflectors 17 and 18 was 30.

Figure 3:
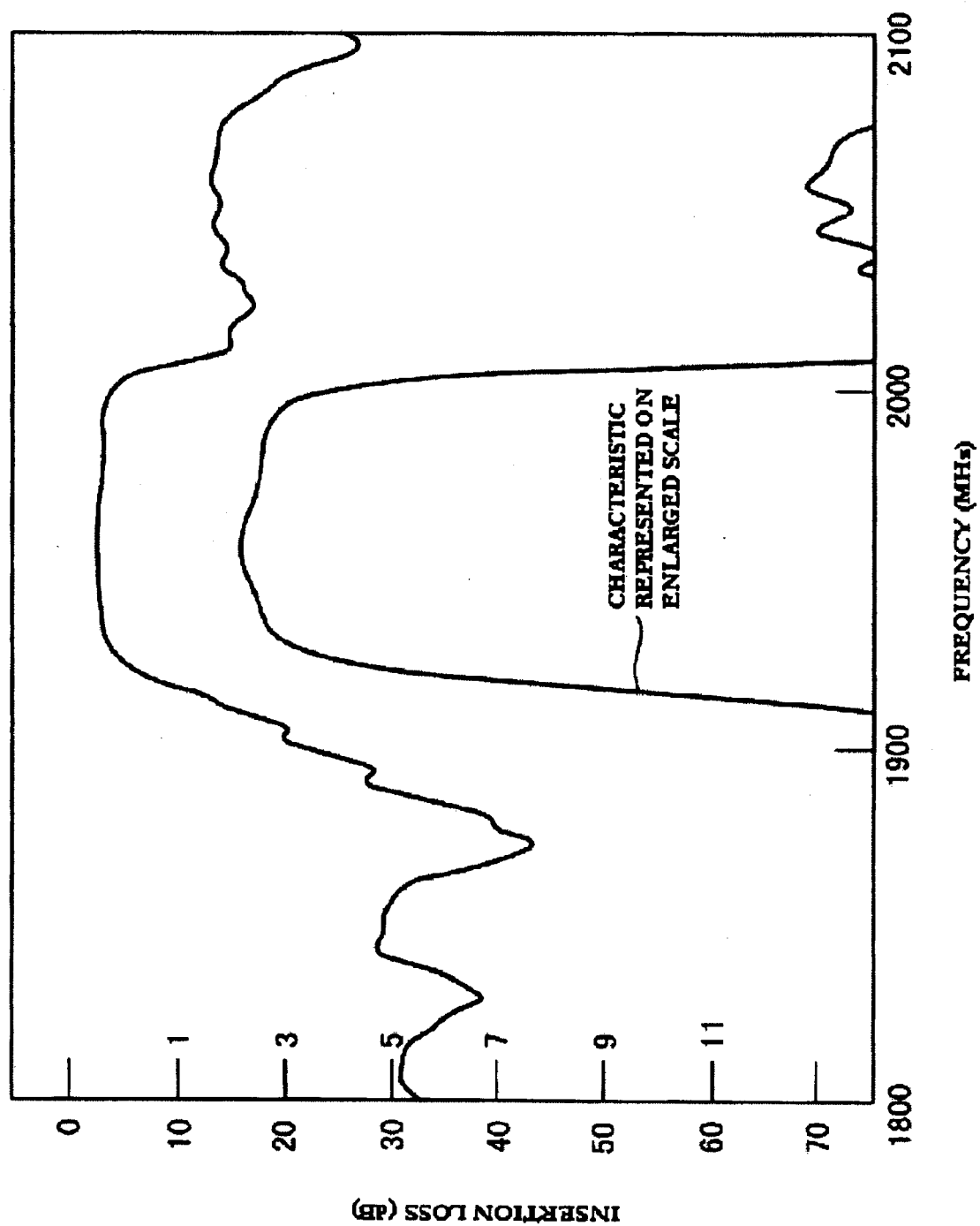
FIG. 3 is a graph showing the frequency characteristic of the SAW device of the first preferred embodiment of the present invention.
Figure 4:
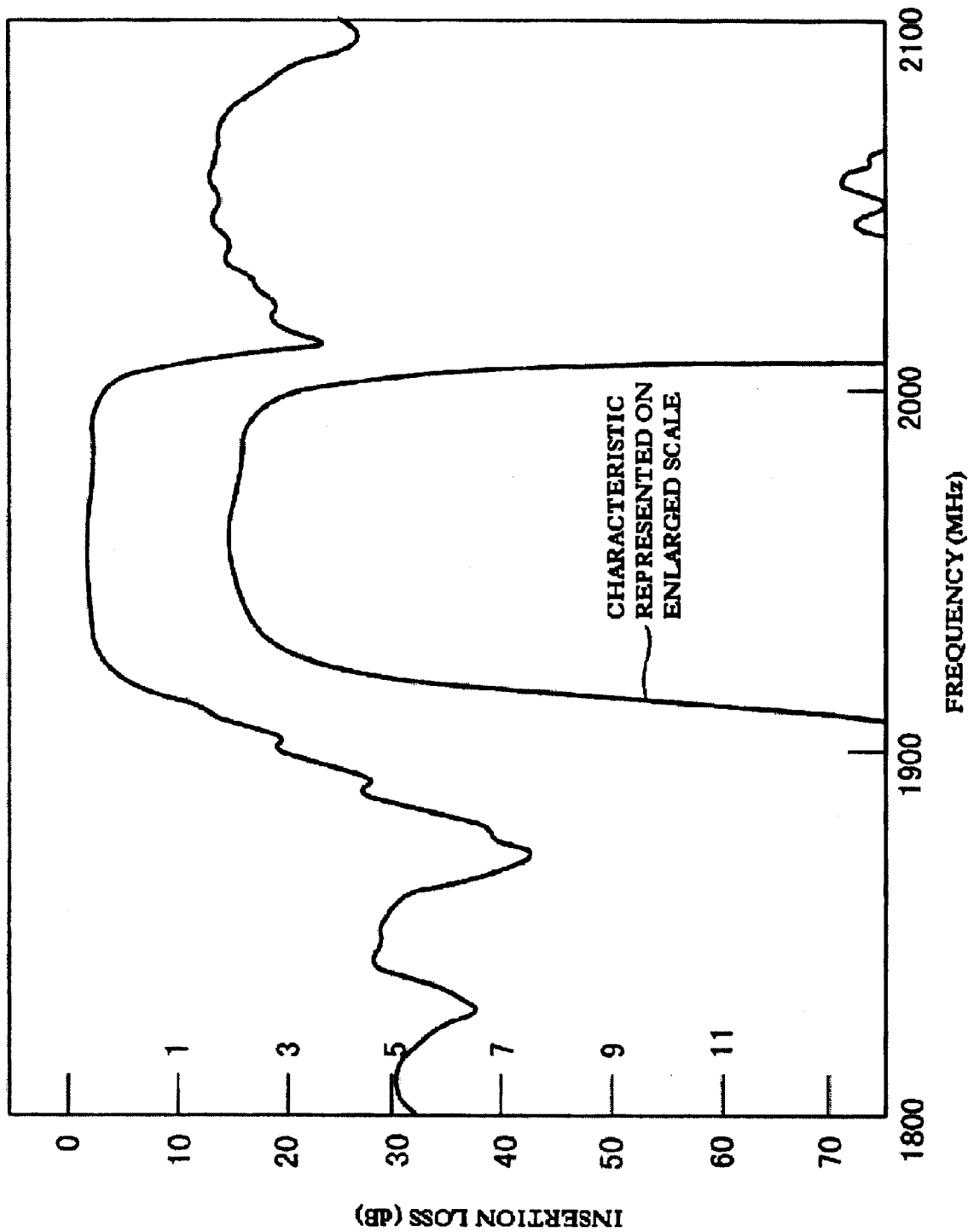
FIG. 4 is a graph showing the frequency characteristic of the SAW device of the first comparative example.

As shown in FIGS. 3 and 4, the frequency characteristic of the SAW device 1 of the first preferred embodiment indicates that the attenuation and the in-band insertion loss at the higher side (in the vicinity of approximately 2,010 MHz to approximately 2,030 MHz) of the passband are slightly deteriorated, compared to the SAW device 1A of the first comparative example. This is because the formation of the SiO₂ film 7 caused an increase in the propagation loss of the one-terminal-pair SAW resonator 4.

The deterioration of the in-band insertion loss, however, is not significant to a degree to which the SAW device 1 cannot be used as an RF filter. The steepness in close proximity to the higher side of the passband of the SAW device 1 is about the same as that of the SAW device 1A.

Next, with respect to the SAW devices 1 and 1A, changes in the frequency characteristics when the temperatures were changed in the range of about −25° C. to about +75° C. were measured. The results of the SAW device 1 and 1A are shown in FIGS. 5 and 6, respectively.

Figure 5:
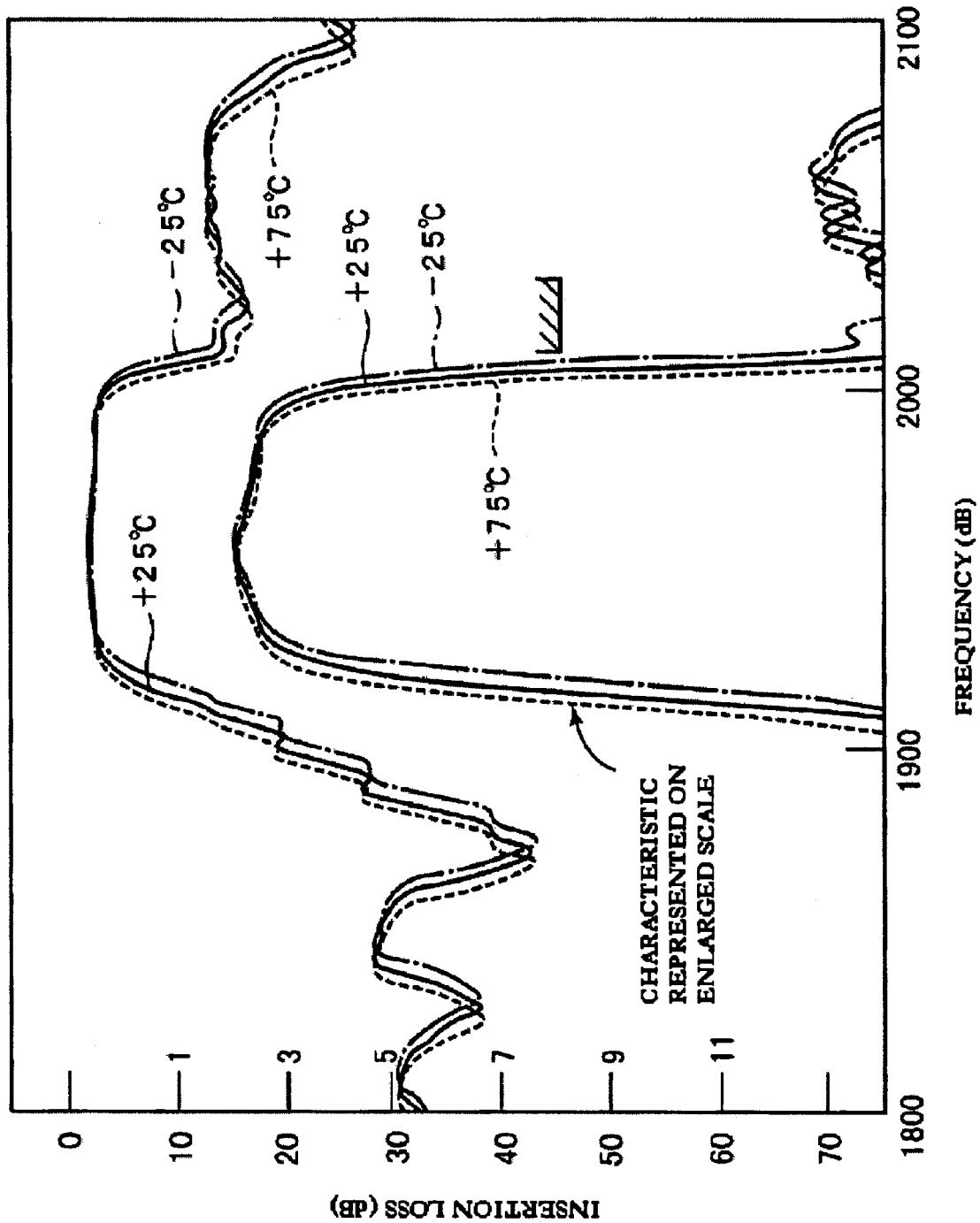
FIG. 5 is a graph showing changes in the frequency characteristic of the SAW device of the first preferred embodiment when the temperature is varied in the range of −25 to +75° C.
Figure 6:
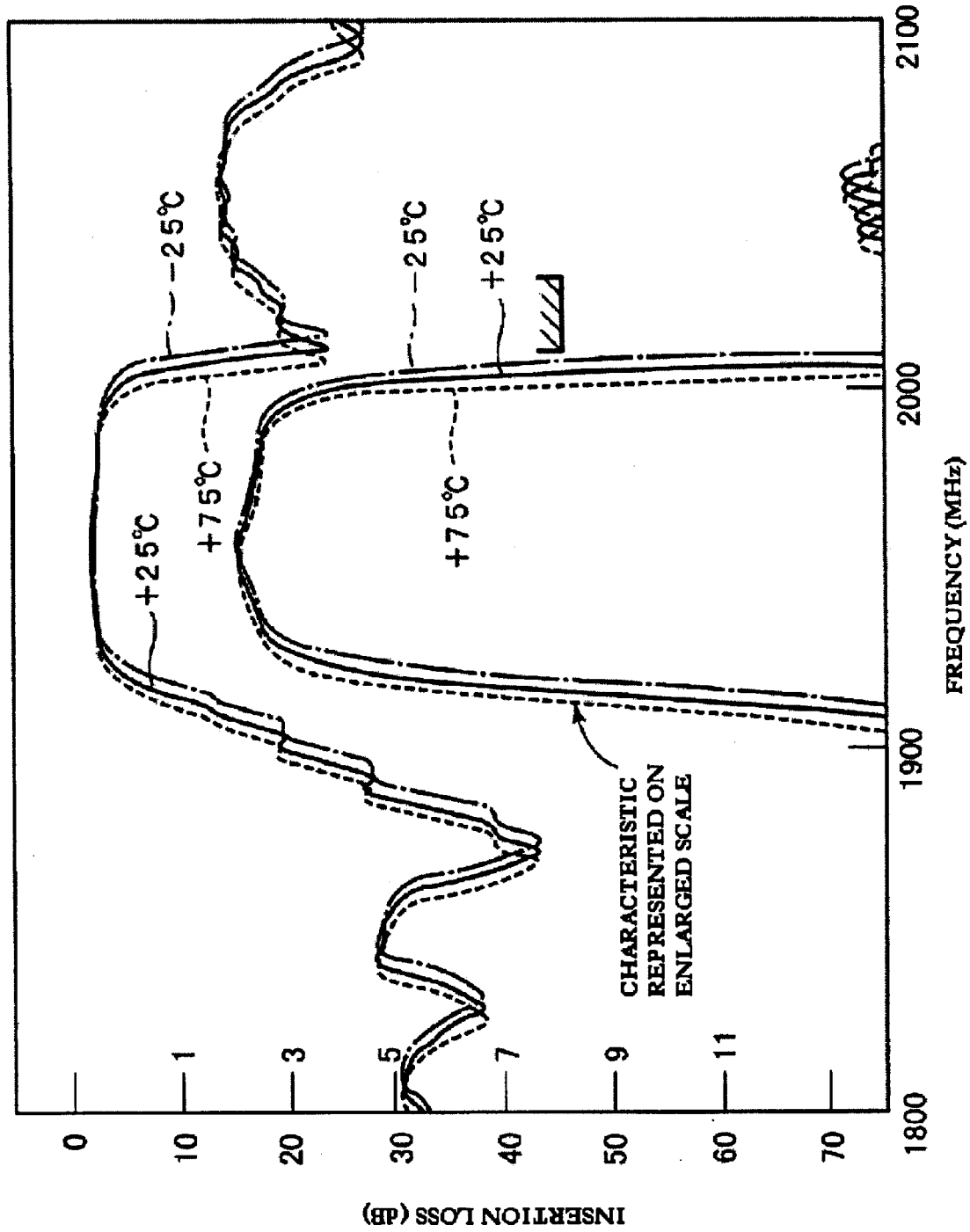
FIG. 6 is a graph showing changes in the frequency characteristic of the SAW device of the first comparative example when the temperature is varied in the range of −25 to +75° C.

It can been seen that the frequency characteristic of the SAW device 1, shown in FIG. 5, exhibits small changes relative to the temperatures at the frequencies in close proximity to the passband, compared to the frequency characteristic of the SAW device 1A, shown in FIG. 6. When the changes are compared in terms of temperature coefficients, at the higher side of the passband, the SAW device 1 A has a temperature coefficient of about −35.1 ppm/° C. at the attenuation of approximately 5 dB from the through-level (0 dB), whereas the SAW device 1 of this preferred embodiment has a temperature coefficient that has been improved up to about −23.8 ppm/° C. The term "temperature coefficient" herein expresses a change in the frequency relative to the temperature in ppm. The reason why it is expressed in ppm is that the degree of a change relative to the temperature varies due to a change in the pitch when the frequency is changed. Frequencies at the attenuation level of approximately 5 dB from the through-level were determined for each temperature, and the resulting data was linearly approximated, so that a coefficient for the frequency change relative to the temperature could be determined. The coefficient for the frequency change relative to the temperature was then divided by the center frequency (1,960 MHz) of the filter to provide the temperature coefficient (ppm).

Thus, it can be understood that, the SAW device 1 of this preferred embodiment can reduce a frequency change in the attenuation zone that exists in close proximity to the passband by about 1.1 MHz, when the operating temperature is in the range of about −25° C. to about +75° C.

Figure 7:
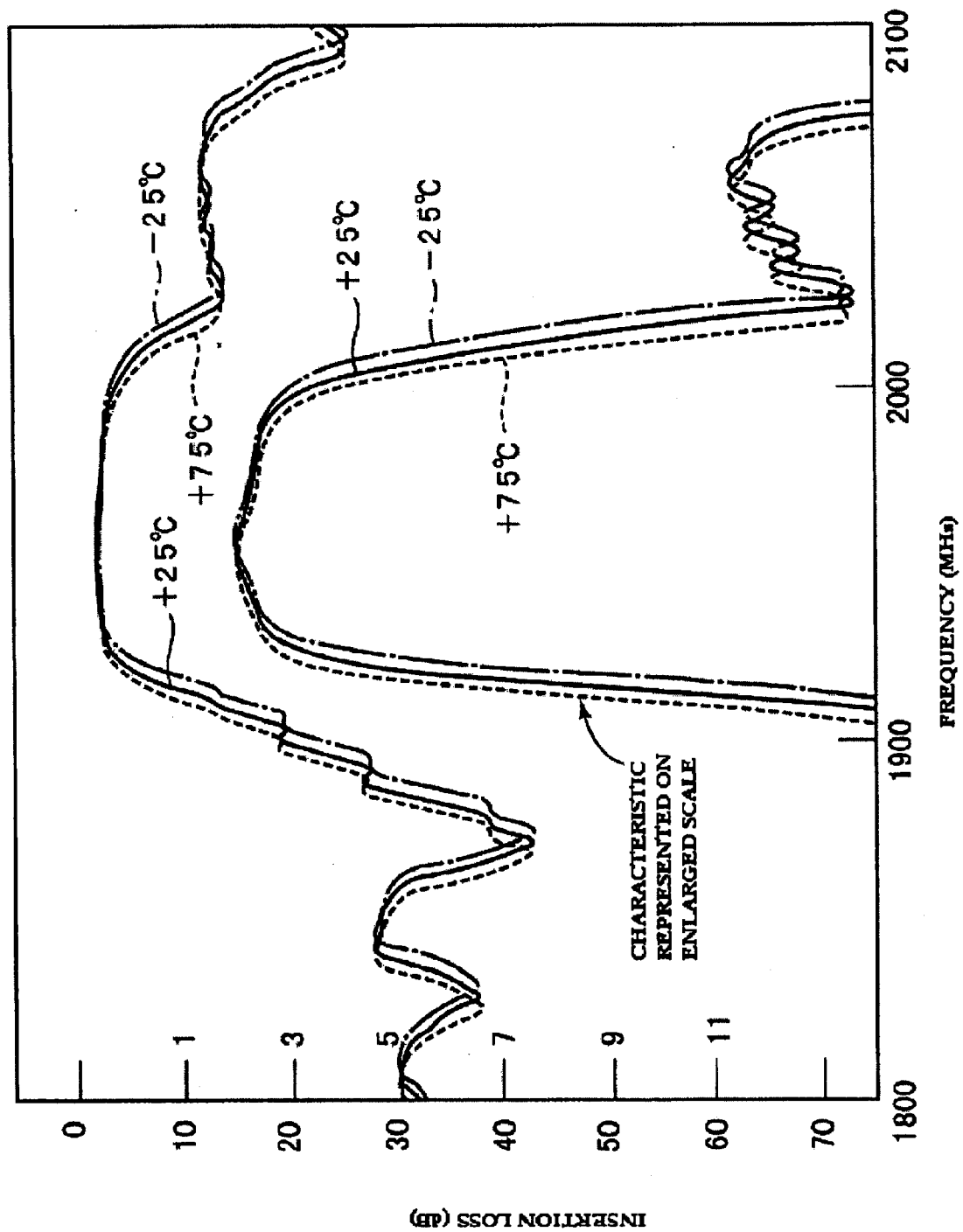
FIG. 7 is a graph showing changes in the frequency characteristic of only the SAW filter of the first preferred embodiment when the temperature is varied in the range of −25 to +75° C.
Figure 8:
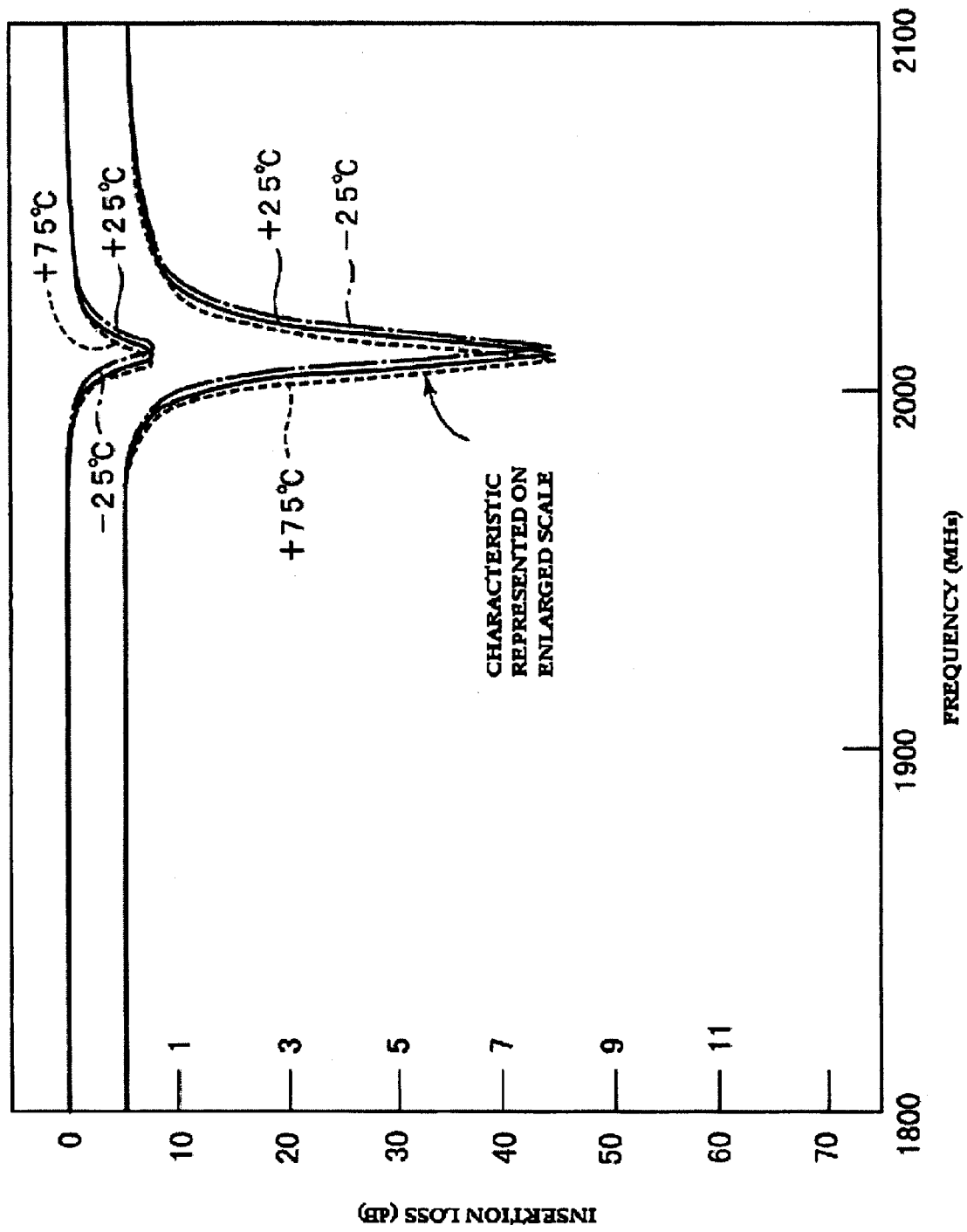
FIG. 8 is a graph showing changes in the frequency characteristic of the one-terminal-pair SAW resonator used in the first preferred embodiment when the temperature is varied in the range of −25 to +75° C.
Figure 9:
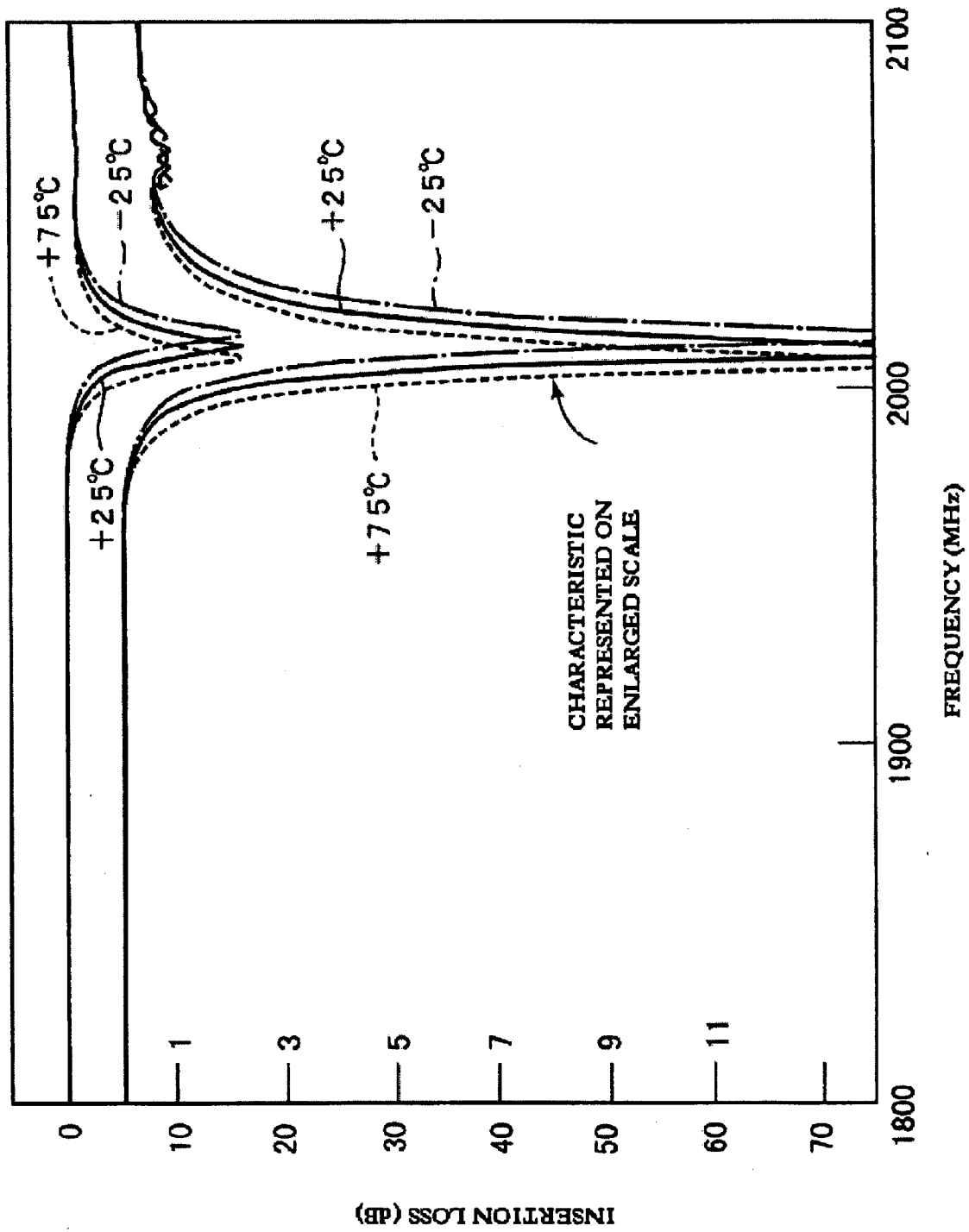
FIG. 9 is a graph showing changes in the frequency characteristic of the one-terminal-pair SAW resonator used in the first comparative example when the temperature is varied in the range of −25 to +75° C.

In order to further clarify the advantage of improving the temperature characteristic, FIGS. 7 to 9 show the frequency characteristics of the SAW filter 3 and one-terminal-pair SAW resonator 4 of the SAW device 1 as well as the temperature characteristic of the one-terminal-pair SAW resonator 4 of the SAW device 1A, when they were separately subjected to temperature changes from about −25° C. to about +75° C. Here, as described above, the SiO₂ film 7 was not deposited on the SAW resonator of the SAW filter 1A.

As shown in FIGS. 7 to 9, the frequencies in the attenuation zone at the higher side of the passband of the SAW filter 3 substantially coincide with the anti-resonant frequency of the one-terminal pair SAW resonator 4. As a result, with respect to the frequency-temperature characteristic in close proximity to the higher side of the passband, when the one-terminal-pair SAW resonator 4 is connected in series to the SAW filter 3, the SAW device 1 will have a substantially intermediate frequency-temperature characteristic therebetween. That is, as in the preferred embodiment described above, setting the anti-resonant frequency of the one-terminal-pair SAW resonator 4 in the attenuation zone at the higher side of the passband of the SAW filter 3 can improve the frequency-temperature characteristic of the one-terminal-pair SAW resonator 4, thereby improving the frequency-temperature characteristic at the higher side of the passband.

When FIGS. 8 and 9 are compared, the SAW resonator 4 of the first preferred embodiment which has a characteristic shown in FIG. 8 exhibits a smaller frequency change relative to the temperature than the SAW resonator 4 of the first comparative example which has a characteristic shown in FIG. 9. Thus, when the SAW resonator 4 having the characteristic shown in FIG. 8 or the SAW resonator 4 having the characteristic shown in FIG. 9 is connected in series to the SAW filter 3 shown in FIG. 7, the SAW resonator 4 having the characteristic shown in FIG. 8 has a smaller frequency change relative to the temperature at the higher frequency side of the passband.

In this case, since a SiO₂ film is not provided on the SAW filter 3, the propagation loss is not significantly deteriorated and the electromechanical coefficient is also not reduced. That is, in the one-terminal-pair resonator that is connected in series to the SAW filter 3, setting the anti-resonant frequency of the one-terminal-pair SAW resonator on which the SiO₂ film is disposed in the attenuation zone at the side of the passband of the SAW filter 3 can inhibit considerable deterioration of the in-band insertion loss. This allows configuration of the SAW device 1 that has a broad band and that has an improved frequency-temperature characteristic at the higher side the passband.

Figure 10:
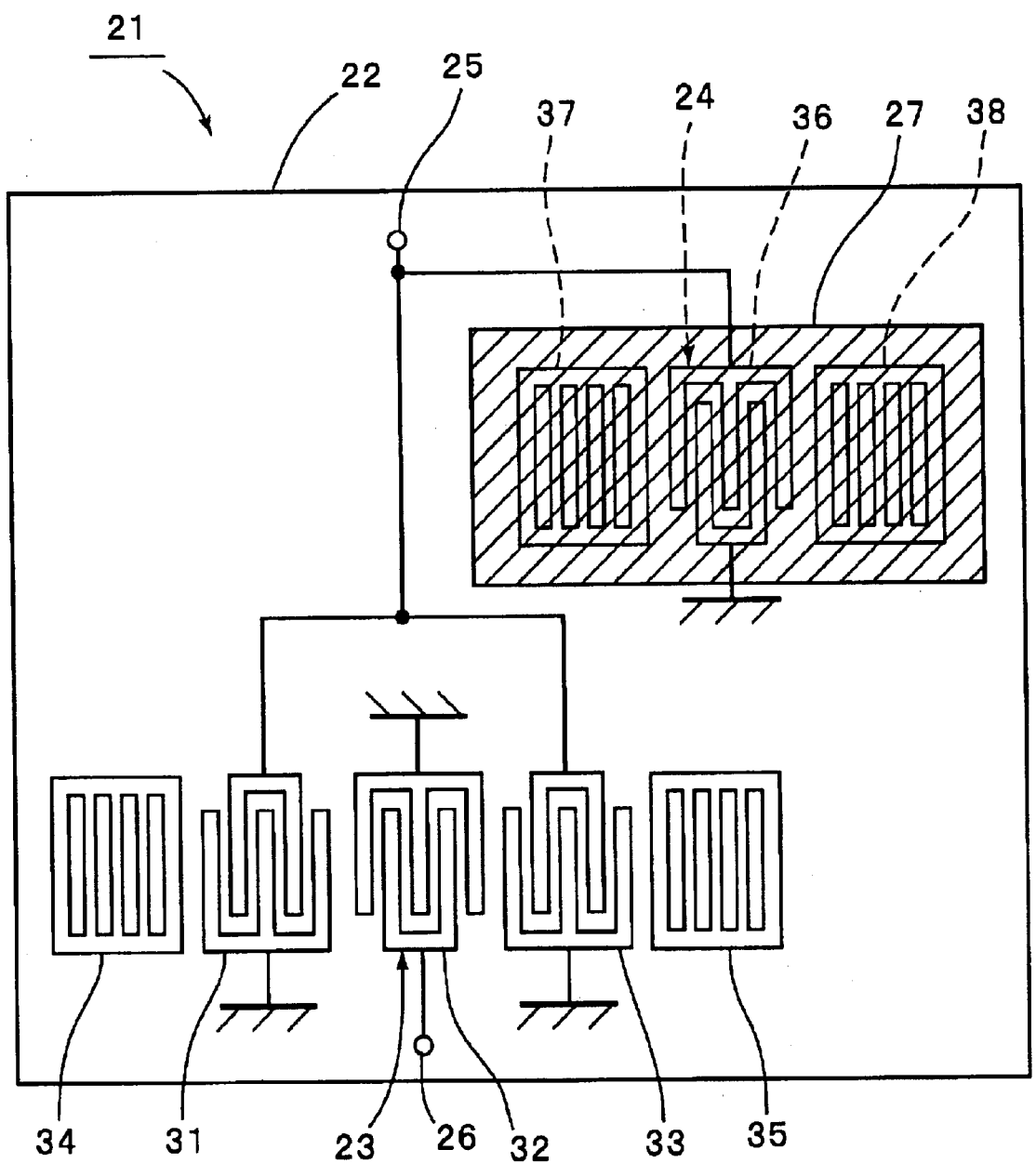
FIG. 10 is a schematic plan view illustrating the circuit configuration of the SAW device of the second preferred embodiment of the present invention.

FIG. 10 is a schematic plan view of a SAW device 21 according to a second preferred embodiment of the present invention. In the SAW device 21 of the second preferred embodiment, a SAW filter 23 and a one-terminal-pair SAW resonator 24 are preferably formed of Al electrodes on a 36° Y-cut X-propagating LiTaO₃ substrate 22. The thickness of the Al electrodes is preferably about 8% of the wavelength that is defined by the pitch of the electrode fingers.

The SAW filter 23 includes a group of three IDTs 31 to 33 arranged along the direction in which the SAW propagates and reflectors 34 and 35 arranged at two opposing ends of the group of the IDTs 31 to 33. That is, the SAW filter 23 is configured as a three-IDT-type SAW resonator filter.

In the one-terminal-pair SAW resonator 24, two reflectors 37 and 38 are arranged at two opposing ends of an IDT 36. A $SiO_2$ film 27 is disposed so as to cover the one-terminal-pair SAW resonator 24.

The thickness of the $SiO_2$ film 27 is preferably about 15% of the wavelength that is defined by the pitch of the electrode fingers. The method for forming the $SiO_2$ film 27 is preferably the same as in the first preferred embodiment of the present invention.

In this preferred embodiment, one end of the IDT 31 and one end of the IDT 33 of the SAW filter 23 are interconnected and are also connected to an input terminal 25. The other end of each of IDTs 31 and 33 is connected to ground potential. One end of the IDT 32 is connected to an output terminal 26, and the other end thereof is connected to ground potential. Further, one end of the IDT 36 of the one-terminal-pair SAW resonator 24 is connected to the input terminal 25 and the other end thereof is connected to ground potential. That is, the one-terminal-pair SAW resonator 24 is connected in parallel to the SAW filter 23.

Figure 11:
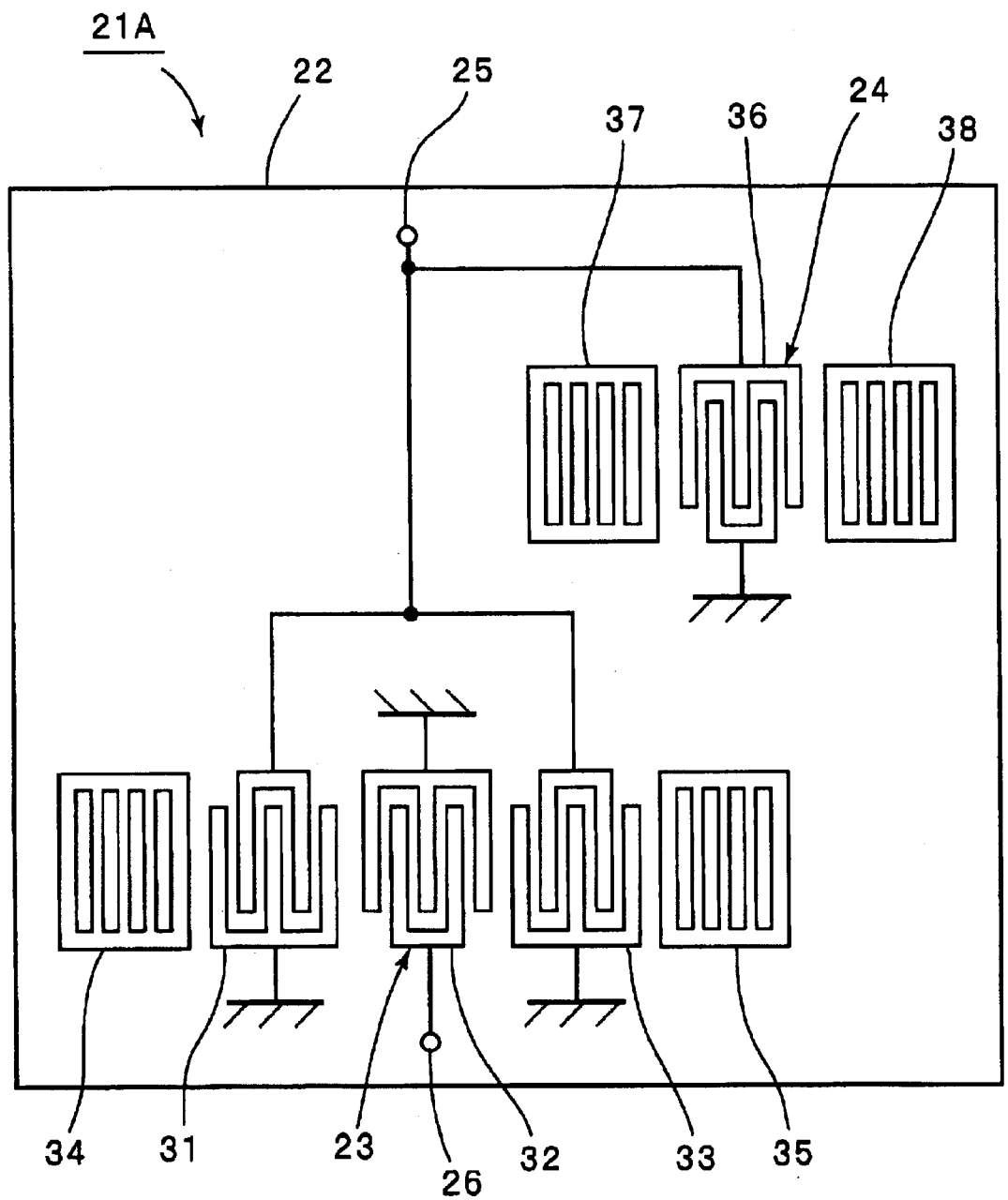
FIG. 11 is a schematic plan view of a SAW device of a second comparative example, in which a SiO$_2$ film is not formed so as to cover the one-terminal-pair SAW resonator.

In order to clarify the advantage of the SAW device 21 of the second preferred embodiment, a SAW device 21 A schematically shown in FIG. 11 was prepared as a second comparative example. The SAW device 21 A was configured in the same manner as the SAW device 21, except that the $SiO_2$ film 27 was not formed so as to cover the one-terminal-pair SAW resonator 24.

In this example, the specifications of the SAW filter 23 and the one-terminal-pair SAW resonator 24 are the same as those of the SAW filter 3 and the one-terminal-pair SAW resonator 4 according to the first preferred embodiment of the present invention.

Figure 12:
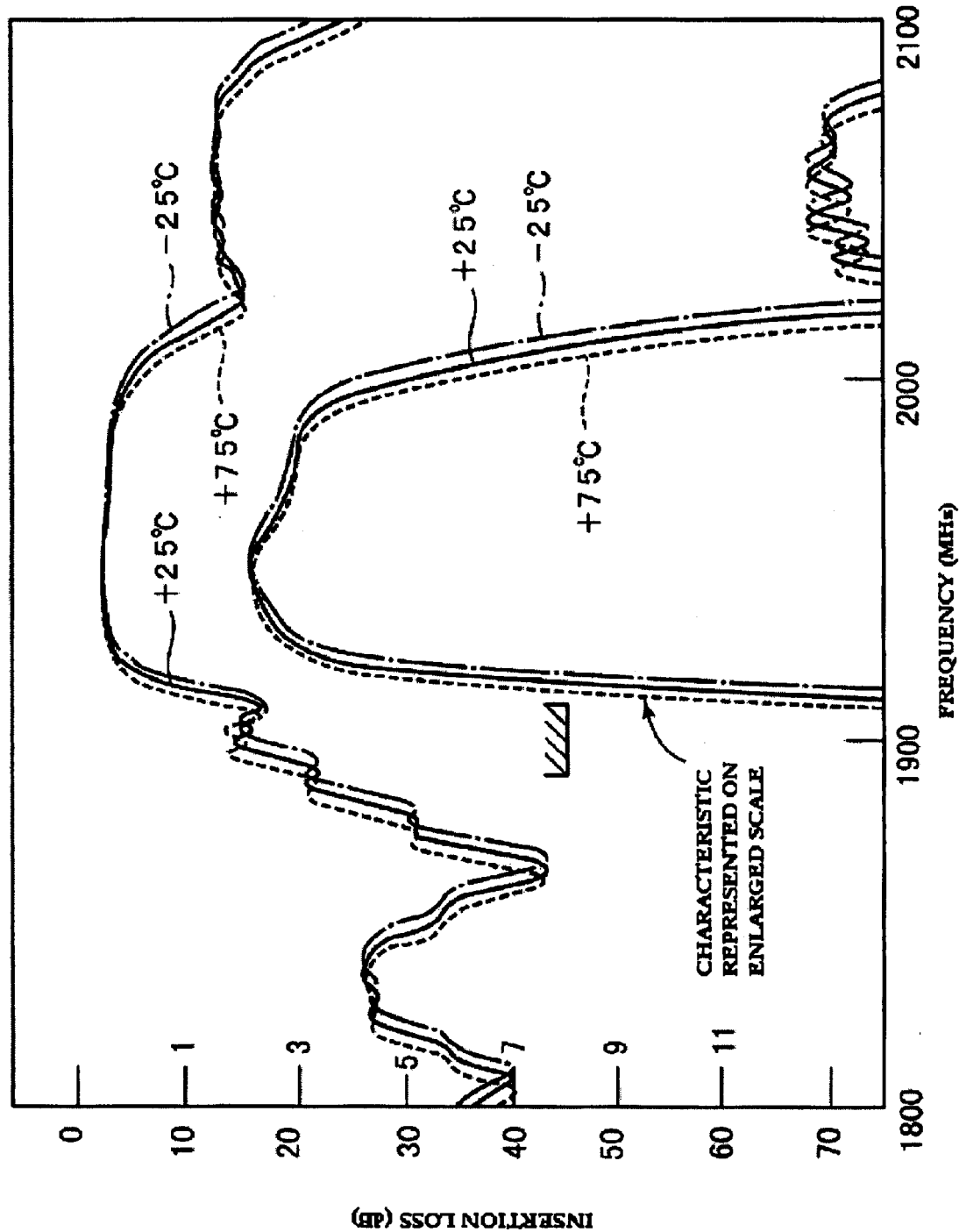
FIG. 12 is a graph showing changes in the frequency characteristic of the SAW device of the second preferred embodiment when the temperature is varied in the range of −25 to +75° C.
Figure 13:
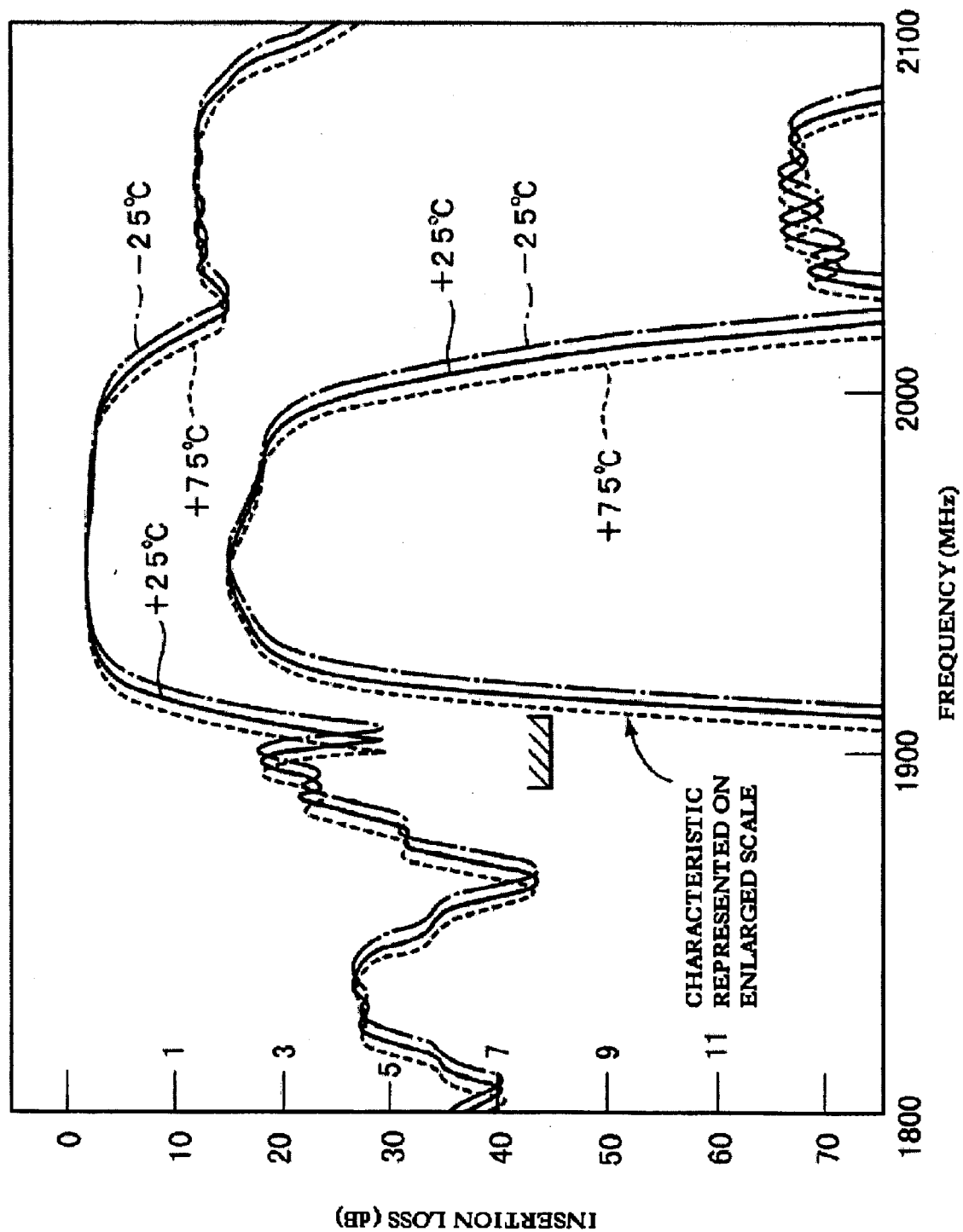
FIG. 13 is a graph showing changes in the frequency characteristic of the SAW device of the second comparative example when the temperature is varied in the range of −25 to +75° C.

FIGS. 12 and 13 show changes in the frequency characteristics of the SAW devices 21 and 21A, respectively, when they were subjected to temperature changes in the range of about −25° C. to about +75° C. As shown in FIGS. 12 and 13, the frequency characteristic of the SAW device 21 of the second preferred embodiment exhibits small changes relative to the temperatures in close proximity to the lower side of the passband, compared to the frequency characteristic of the SAW device 21A of the second comparative example. When these are compared in terms of temperature coefficients, at the lower side of the passband, the SAW device 21A of the second comparative example has a temperature coefficient of about −35.7 ppm/° C. at the attenuation of 5 dB from the through-level (0 dB), whereas the SAW device 21 of the second preferred embodiment has a temperature coefficient that has been improved up to about −25.6 ppm/° C.

Accordingly, the SAW device 21 of the second preferred embodiment can reduce frequency changes in the attenuation zone that are in close proximity to the lower side of the passband by about 1.0 MHz, when the operating temperature is in the range of about −25° C. to about +75° C.

The above-described advantage can be achieved due to the following reasons. The one-terminal-pair SAW resonator 24 on which the $SiO_2$ film is deposited is connected in parallel to the SAW filter 23, and the resonant frequency of the one-terminal-pair SAW resonator 24 is designed to be located within the attenuation zone at the lower side of the passband. As a result, the frequency-temperature characteristic at the lower side of the passband of the SAW device 21 exhibits a frequency-temperature characteristic that is substantially intermediate between the frequency-temperature characteristics of the SAW filter 23 and that of the one-terminal-pair SAW resonator 24. Thus, setting the resonant frequency of the one-terminal-pair SAW resonator 24, which has the $SiO_2$ film deposited thereon and is connected in parallel to the SAW filter 23, in the attenuation zone at the lower side of the passband of the SAW filter 23 can provide the SAW device 21 having a broad band and having an improved frequency-temperature characteristic at the lower side of the passband, without inducing considerable insertion loss within the passband.

Figure 14:
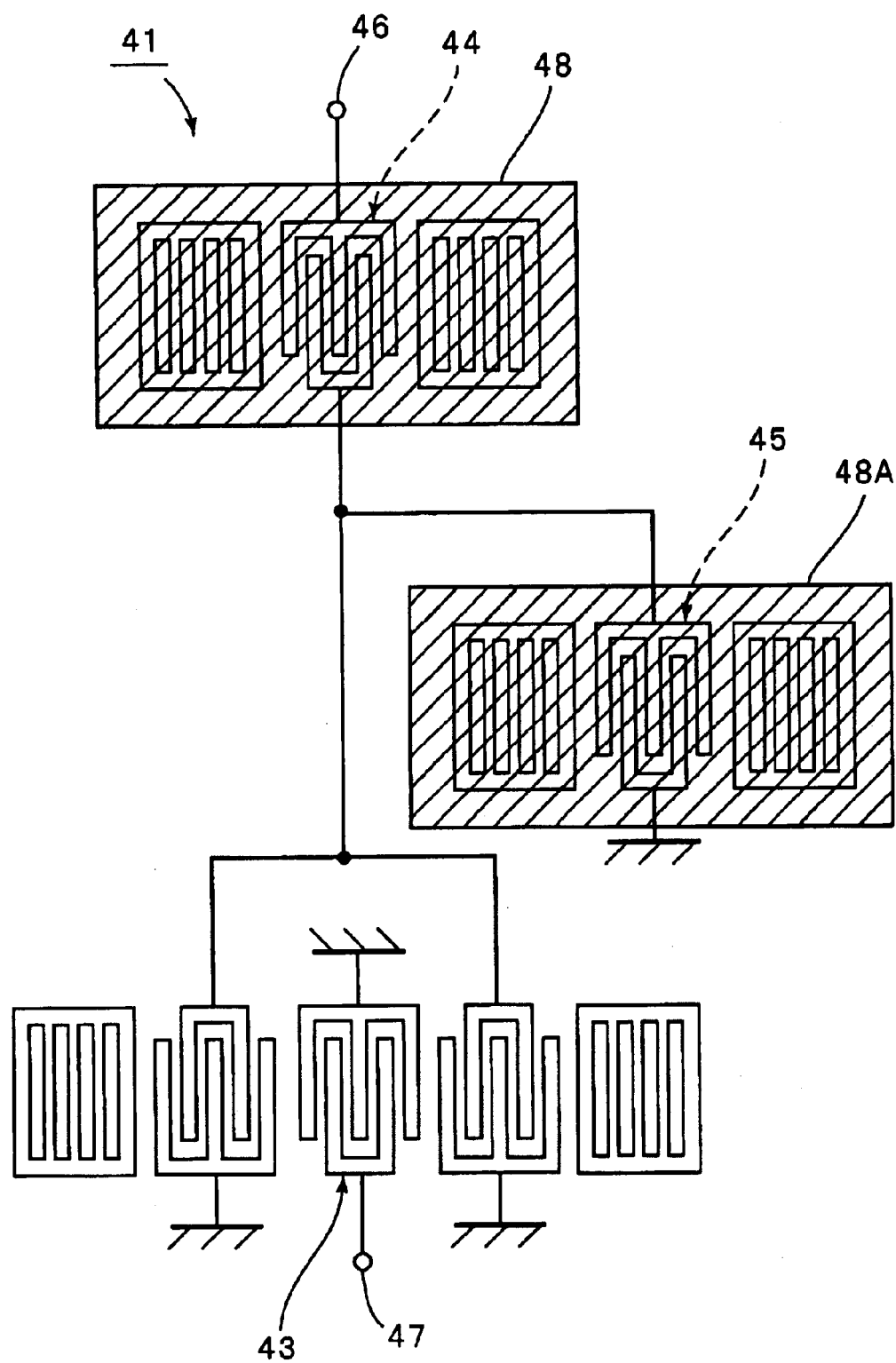
FIG. 14 is a schematic plan view of a SAW device according to a third preferred embodiment of the present invention.

FIG. 14 is a schematic plan view of a SAW device according to a third preferred embodiment of the present invention. A SAW filter device 41 includes, on a 36° Y-cut X-propagating $LiTaO_3$ piezoelectric substrate (not shown), a SAW filter 43, a one-terminal pair SAW resonator 44 connected in series to the SAW filter 43, and a one-terminal-pair SAW resonator 45 connected in parallel. The SAW filter 43 and the one-terminal-pair SAW resonators 44 and 45 are preferably made of Al electrodes. The thickness of the Al electrodes is preferably about 8% of the wavelength that is defined by the pitch of the electrode fingers.

$SiO_2$ films 48 and 48A are disposed so as to cover the one-terminal-pair SAW resonators 44 and 45, respectively. No $SiO_2$ film is formed on the SAW filter 43.

That is, the SAW device 41 has a structure that corresponds to a combination of the SAW devices 1 and 21 of the first and second preferred embodiments. The SAW filter 43 is preferably configured in the same manner as the SAW filters 3 and 23. The SAW resonator 44 is also configured in the same manner as the SAW resonator 4 used in the first preferred embodiment, and the SAW resonator 45 is also configured in the same manner as the SAW resonator 24 used in the second preferred embodiment.

Referring to FIG. 14, reference numeral 46 indicates an input terminal and 47 indicates an output terminal.

In this preferred embodiment, the thickness of the $SiO_2$ films 48 and 48A is preferably about 15% of the wavelength defined by the pitch of the electrode fingers. The method for forming the $SiO_2$ film is preferably the same as that in the first preferred embodiment.

Figure 15:
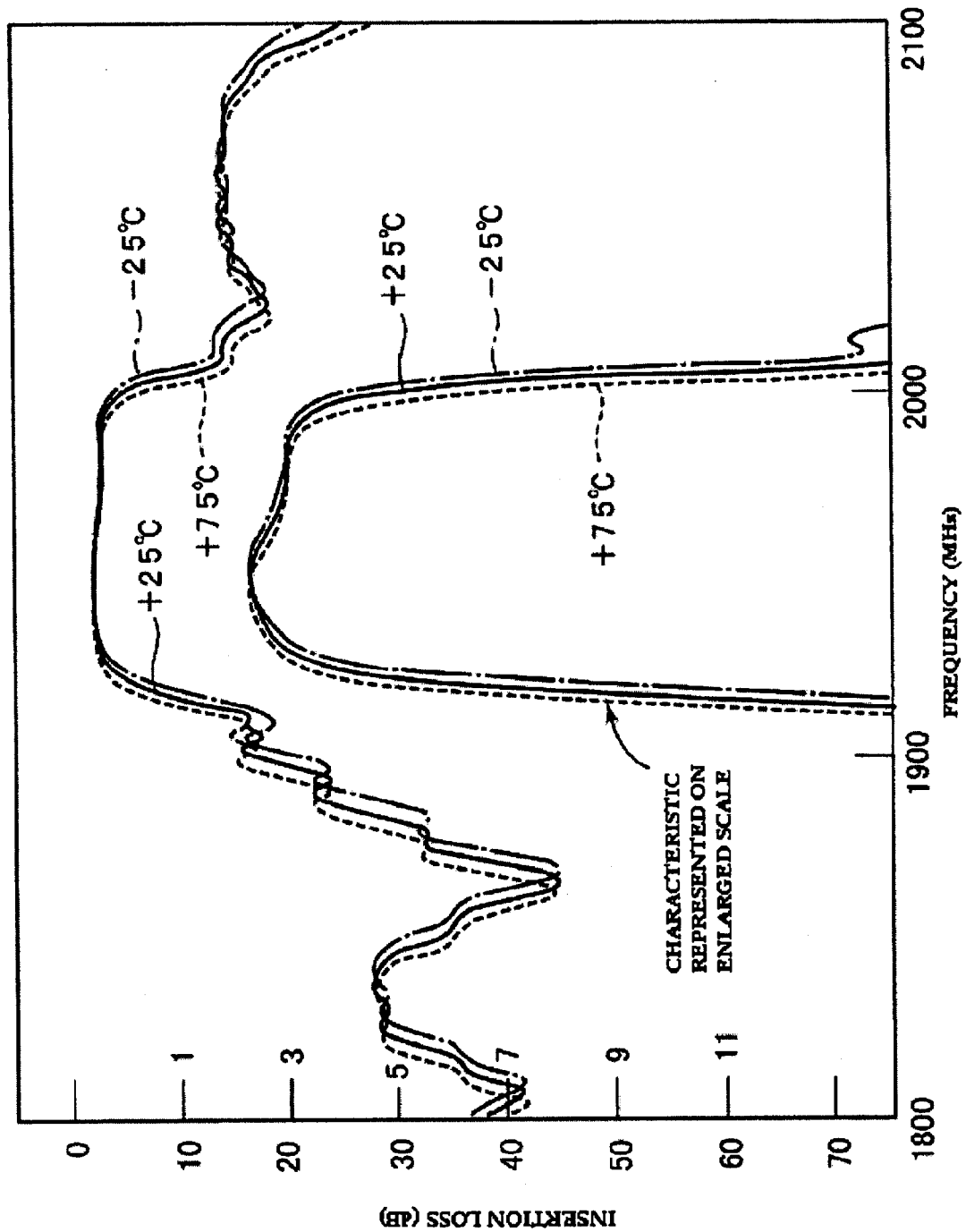
FIG. 15 is a graph showing changes in the frequency characteristic of the SAW device of the third preferred embodiment when the temperature is varied in the range of −25 to +75° C.
Figure 16:
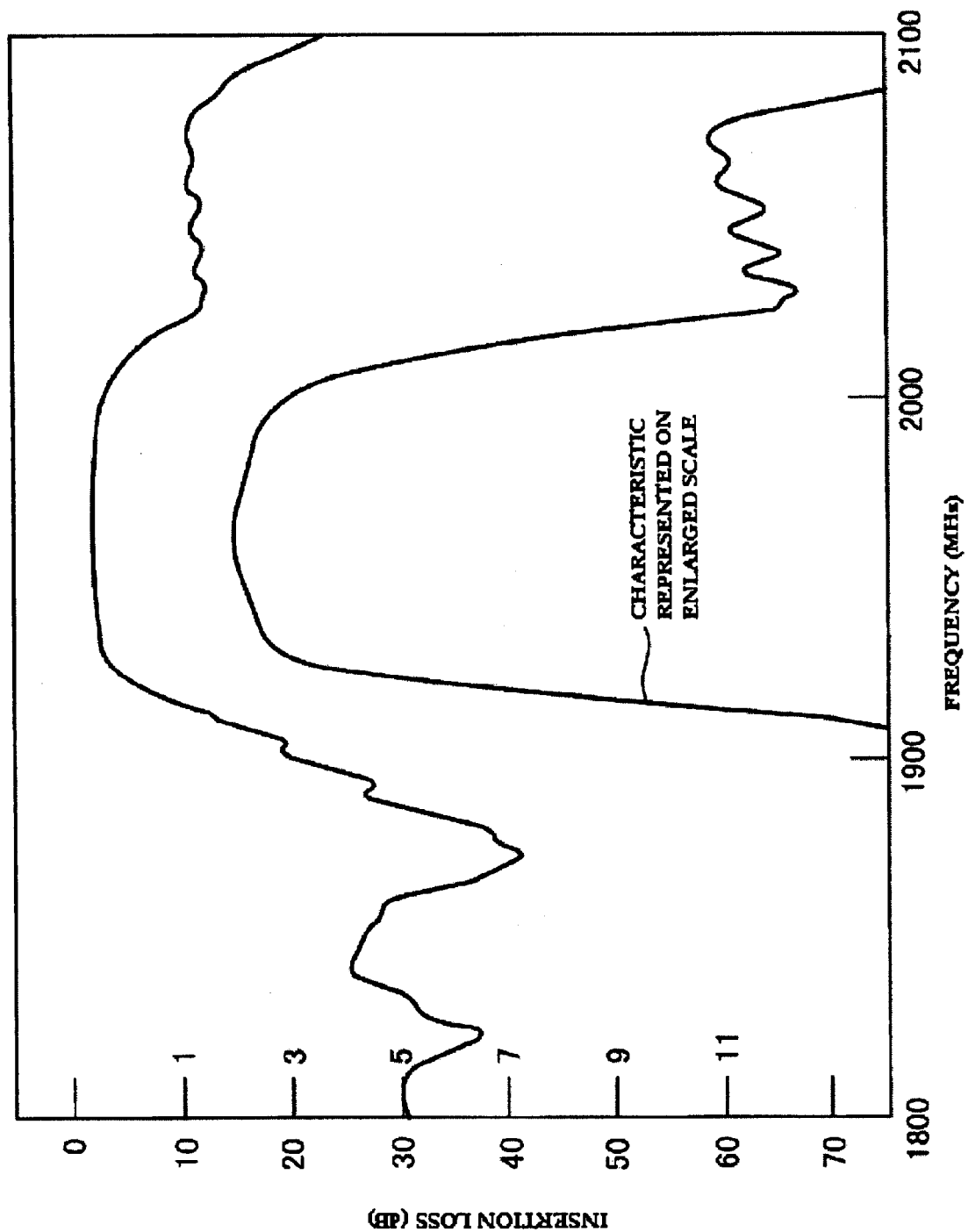
FIG. 16 is a graph showing the frequency characteristic of a SAW device of the related art, in which a longitudinally-coupled three-IDT-type resonator filter is disposed on a 36° Y-cut X-propagating LiTaO$_3$ substrate.
Figure 17:
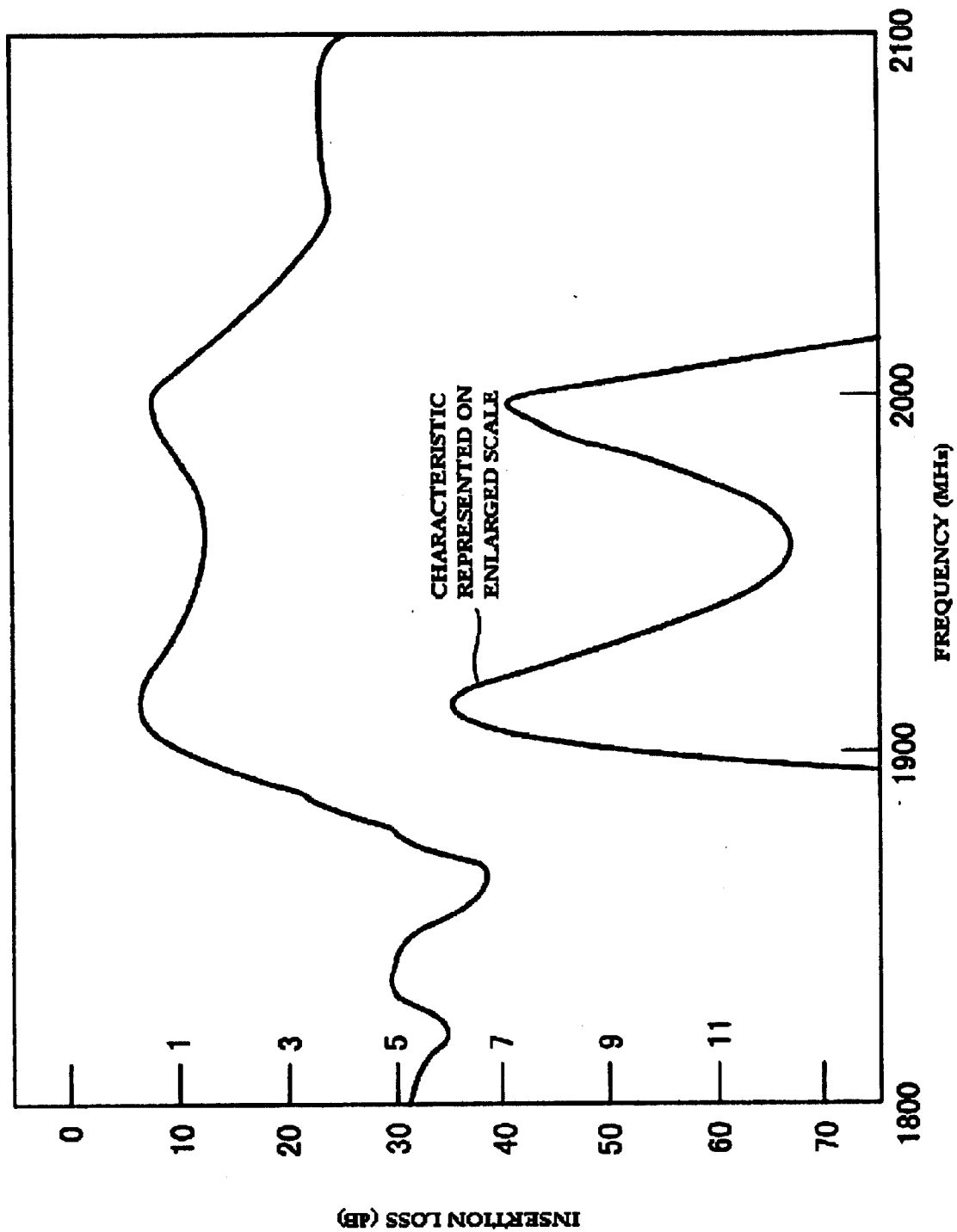
FIG. 17 is a graph showing the frequency characteristic of the SAW filter of the related art shown in FIG. 16 when a SiO$_2$ film having a thickness equal to 15% of the wavelength that is defined by the pitch of electrode fingers is deposited.

FIG. 15 shows changes in the frequency characteristic of the SAW device 41 of the present preferred embodiment when it is subjected to temperature changes in the range of about −25° C. to about +75° C. In this case, the SAW filter 43 and SAW resonators 44 and 45 are preferably configured in the same manner as in the first and second preferred embodiments.

As shown in FIG. 15, the frequency characteristic of the third preferred embodiment exhibits small changes relative to the temperatures at frequencies in close proximity to the lower side and higher side of the passband. When these are evaluated in terms of temperature coefficients, at the lower side of the passband, the temperature coefficient at the frequencies at the attenuation of approximately 5 dB from the through-level (0 dB) is about −25.3 ppm/° C., and at the higher side of the passband, the temperature coefficient at the frequencies at the attenuation of approximately 5 dB from the through-level (0 dB) is about −25.7 ppm/° C. Thus, the SAW device 41 of this preferred embodiment can improve the frequency-temperature characteristic throughout the passband, compared to the SAW devices 1A and 21A of the first and second comparative examples.

The SAW device 41 of the third preferred embodiment has a structure in which those of the first and second preferred embodiments are combined. That is, the anti-resonant frequency of the one-terminal-pair SAW resonator 34, which is connected in series to the SAW filter 33, is located in the attenuation zone at the higher side of the passband, and the resonant frequency of the one-terminal-pair SAW resonator 45, which is connected in parallel, is located in the attenuation zone at the lower side of the passband. Consequently, the SAW device 41 can provide both advantages of the first and second preferred embodiments. Accordingly, the SAW device 41 has a broad band and has an improved frequency-temperature characteristic throughout the passband, without inducing considerable deterioration of insertion loss in the passband.

While a $SiO_2$ film is preferably not formed on the SAW filters 3, 23, and 43 in the first to third preferred embodiments, for example, a second $SiO_2$ film 7A may be formed so as to cover the SAW filter 3, as indicated schematically by broken lines in FIG. 1. In such a case, the thickness of the second $SiO_2$ film 7A is preferably smaller than the $SiO_2$ film 7 (a first $SiO_2$ film) covering the one-terminal-pair SAW resonator 4. That is, the second $SiO_2$ film 7A may be formed so as to cover the SAW filter 3 as a protection layer for preventing, for example, metal powder from attaching thereto. In such a case, the second $SiO_2$ film 7A preferably has a thickness that is smaller than the first $SiO_2$ film 7. That is, a $SiO_2$ film 7A that is thin enough such that the frequency characteristic of the SAW filter 3 is not deteriorated may be formed. Even when such a thin second $SiO_2$ film 7A is formed, forming the first $SiO_2$ film 7 in the same manner as the first preferred embodiment can improve the frequency-temperature characteristic without inducing considerable deterioration of the insertion loss within the passband, as in the first preferred embodiment. Similarly, also in the second and third preferred embodiments, second $SiO_2$ films having a thickness smaller than the first $SiO_2$ film that covers the SAW resonator 4 may be formed so as to cover the SAW filters 23 and 43 to such a degree to which the insertion loss characteristic is not deteriorated. This can improve the frequency-temperature characteristic, in the same manner as the second and third preferred embodiments, without inducing considerable deterioration of the insertion loss within the passband.

One SAW resonator 4 is connected in series to the SAW filter 3 in the first preferred embodiment and one SAW resonator 24 is connected in parallel to the SAW filter 23 in the second preferred embodiment. However, in each case, a plurality of SAW resonators may be connected. In such a case, when a $SiO_2$ film is formed to cover at least one of the plurality of SAW resonators, it is possible to improve the frequency-temperature characteristic in the same manner as the first or second preferred embodiments.

In the third preferred embodiment, one SAW resonator 44 is connected in series and one SAW resonator 45 is connected in parallel to the SAW filter 43. However, a plurality of SAW resonators may be connected in series and a plurality of SAW resonators may be connected in parallel. In addition, a plurality of SAW resonators connected in series and a plurality of SAW resonators connected in parallel may be concurrently used. In any case, when a $SiO_2$ film is disposed on at least one of the SAW resonators, it is possible to improve the frequency-temperature characteristic in the same manner as the first and second preferred embodiments. Preferably, as in the third preferred embodiment, $SiO_2$ films are disposed on both of the SAW resonator (or resonators) connected in series and the SAW resonator (or resonators) connected in parallel, so that the frequency-temperature characteristic over a wide range of the passband can be improved.

As described in the first preferred embodiment, in the SAW devices according to the present invention, a portion of a film that is disposed so as to cover the one-terminal-pair SAW resonator (or resonators) and that has a positive frequency-temperature characteristic is etched away from at least one of the SAW resonators, so that the frequency can be adjusted. This can easily provide a SAW device having a desired reception frequency.

While a $SiO_2$ film has been used as a film having a positive frequency-temperature characteristic in the above-described preferred embodiments, a silicon oxide film other than a $SiO_2$ film may be used, or another film having a positive frequency-temperature characteristic, such as a silicon nitride film, may also be used.

While a 36° Y-cut X-propagating $LiTaO_3$ substrate has been used as the piezoelectric substrate in the above-described preferred embodiments, the present invention is not limited thereto. Thus, the present invention can also be applied to a SAW device using a 36° to 44° Y-cut X-propagating $LiTaO_3$ substrate, i.e., a piezoelectric substrate having a negative temperature coefficient.

In addition, in the present invention, a plurality of SAW filters may be provided on the piezoelectric substrate.

While preferred embodiments of the invention have been described above, it is to be understood that variations and modifications will be apparent to those skilled in the art without departing the scope and spirit of the invention. The scope of the invention, therefore, is to be determined solely by the following claims.

What is claimed is:

1. A surface acoustic wave device comprising:
   a piezoelectric substrate having a negative frequency-temperature characteristic;
   at least one surface acoustic wave filter provided on said piezoelectric substrate;
   at least one one-terminal-pair surface-acoustic-wave resonator that is provided on said piezoelectric substrate and that is connected in at least one of series and parallel to said surface acoustic wave filter; and
   at least one film disposed so as to cover said at least one one-terminal-pair surface-acoustic-wave resonator except for a region in which said surface acoustic wave filter is provided, said at least one film having a positive frequency-temperature characteristic.

2. A surface acoustic wave device according to claim 1, wherein said at least one film is disposed so as to cover said at least one one-terminal-pair surface-acoustic-wave resonator that is connected in series to said surface acoustic wave filter, and the anti-resonant frequency of said at least one one-terminal-pair surface-acoustic-wave resonator is located in an attenuation zone at the higher side of the passband of said surface acoustic wave filter.

3. A surface acoustic wave device according to claim 1, wherein said at least one film is disposed so as to cover said at least one one-terminal-pair surface-acoustic-wave resonator that is connected in parallel to said surface acoustic wave filter, and the resonant frequency of said at least one one-terminal-pair surface-acoustic-wave resonator is located in an attenuation zone at the lower side of the passband of said surface acoustic wave filter.

4. A surface acoustic wave device according to claim 1, wherein said at least one film is disposed so as to cover at least one one-terminal-pair surface-acoustic-wave resonator that is connected in series to said surface acoustic wave filter, and the anti-resonant frequency of said one-terminal-pair surface-acoustic-wave resonator is located in an attenuation zone at the higher side of the passband of said surface acoustic wave filter, and wherein said at least one film is disposed so as to cover at least one one-terminal-pair surface-acoustic-wave resonator that is connected in parallel to said surface acoustic wave filter, and the resonant frequency of said one-terminal-pair surface-acoustic-wave resonator that is connected in parallel to said surface acoustic wave filter is located in an attenuation zone at the lower side of the passband of said surface acoustic wave filter.

5. A surface acoustic wave device according to claim 1, wherein said at least one film is a silicon oxide film.

6. A surface acoustic wave device according to claim 5, wherein the silicon oxide film is an $SiO_2$ film.

7. A surface acoustic wave device according to claim 1, wherein said piezoelectric substrate is a 36° to 44° Y-cut X-propagating $LiTaO_3$ substrate.

8. A surface acoustic wave device comprising:
   a piezoelectric substrate;
   at least one surface acoustic wave filter provided on said piezoelectric substrate;
   at least one one-terminal-pair surface-acoustic-wave resonator that is provided on said piezoelectric substrate and that is connected in at least one of series and parallel to said surface acoustic wave filter;
   at least one first film disposed so as to cover said at least one one-terminal-pair surface-acoustic-wave resonator, said at least one first film having a positive frequency-temperature characteristic; and
   a second film disposed so as to cover said surface acoustic wave filter, said second film having a positive frequency-temperature characteristic; wherein
   the thickness of said second film is smaller than the thickness of said at least one first film.

9. A surface acoustic wave device according to claim 8, wherein said at least one first film is disposed so as to cover said at least one one-terminal-pair surface-acoustic-wave resonator that is connected in series to said surface acoustic wave filter, and the anti-resonant frequency of said one-terminal-pair surface-acoustic-wave resonator is located in an attenuation zone at the higher side of the passband of said surface acoustic wave filter.

10. A surface acoustic wave device according to claim 8, wherein said at least one first film is disposed so as to cover said at least one one-terminal-pair surface-acoustic-wave resonator that is connected in parallel to said surface acoustic wave filter, and the resonant frequency of said one-terminal-pair surface-acoustic-wave resonator is located in an attenuation zone at the lower side of the passband of said surface acoustic wave filter.

11. A surface acoustic wave device according to claim 8, wherein said at least one first film is disposed so as to cover at least one one-terminal-pair surface-acoustic-wave resonator that is connected in series to said surface acoustic wave filter, and the anti-resonant frequency of said one-terminal-pair surface-acoustic-wave resonator is located in an attenuation zone at the higher side of the passband of said surface acoustic wave filter, and wherein said at least one first film is disposed so as to cover at least one one-terminal-pair surface-acoustic-wave resonator that is connected in parallel to said surface acoustic wave filter, and the resonant frequency of said one-terminal-pair surface-acoustic-wave resonator that is connected in parallel to said surface acoustic wave filter is located in an attenuation zone at the lower side of the passband of said surface acoustic wave filter.

12. A surface acoustic wave device according to claim 8, wherein said at least one first film is a silicon oxide film.

13. A surface acoustic wave device according to claim 12, wherein the silicon oxide film is a $SiO_2$ film.

14. A surface acoustic wave device according to claim 8, wherein said piezoelectric substrate is a 36° to 44° Y-cut X-propagating $LiTaO_3$ substrate.

15. A method for adjusting the frequency of a surface acoustic wave device comprising the steps of:
   providing a surface acoustic wave device including a piezoelectric substrate having a negative frequency-temperature characteristic, at least one surface acoustic wave filter provided on said piezoelectric substrate, at least one one-terminal-pair surface-acoustic-wave resonator that is provided on said piezoelectric substrate and that is connected in at least one of series and parallel to said surface acoustic wave filter, and at least one film disposed so as to cover said at least one one-terminal-pair surface-acoustic-wave resonator except for a region in which said surface acoustic wave filter is provided, said at least one film having a positive frequency-temperature characteristic; and
   etching a portion of said at least one film having said positive frequency-temperature characteristic in said at least one one-terminal-pair resonator on which said at least one film is disposed, so as to adjust the frequency of the surface acoustic wave device.

16. The method according to claim 15, wherein said at least one film is disposed so as to cover said at least one one-terminal-pair surface-acoustic-wave resonator that is connected in series to said surface acoustic wave filter, and the anti-resonant frequency of said at least one one-terminal-pair surface-acoustic-wave resonator is located in an attenuation zone at the higher side of the passband of said surface acoustic wave filter.

17. The method according to claim 15, wherein said at least one film is disposed so as to cover said at least one one-terminal-pair surface-acoustic-wave resonator that is connected in parallel to said surface acoustic wave filter, and the resonant frequency of said at least one one-terminal-pair surface-acoustic-wave resonator is located in an attenuation zone at the lower side of the passband of said surface acoustic wave filter.

18. The method according to claim 15, wherein said at least one film is disposed so as to cover at least one one-terminal-pair surface-acoustic-wave resonator that is connected in series to said surface acoustic wave filter, and the anti-resonant frequency of said one-terminal-pair surface-acoustic-wave resonator is located in an attenuation zone at the higher side of the passband of said surface acoustic wave filter, and wherein said at least one film is disposed so as to cover at least one one-terminal-pair surface-acoustic-wave resonator that is connected in parallel to said surface acoustic wave filter, and the resonant frequency of said one-terminal-pair surface-acoustic-wave resonator that is connected in parallel to said surface acoustic wave filter is located in an attenuation zone at the lower side of the passband of said surface acoustic wave filter.

19. A method for adjusting the frequency of a surface acoustic wave device comprising the steps of:
   providing a surface acoustic wave device including a piezoelectric substrate, at least one surface acoustic wave filter provided on said piezoelectric substrate, at least one one-terminal-pair surface-acoustic-wave resonator that is provided on said piezoelectric substrate and that is connected in at least one of series and parallel to said surface acoustic wave filter, at least one first film disposed so as to cover said at least one one-terminal-pair surface-acoustic-wave resonator, said at least one first film having a positive frequency-temperature characteristic, and a second film disposed so as to cover said surface acoustic wave filter, said second film having a positive frequency-temperature characteristic, wherein the thickness of said second film is smaller than the thickness of said at least one first film; and etching a portion of said at least one first film having said positive frequency-temperature characteristic in said at least one one-terminal-pair resonator on which said at least one first film is disposed, so as to adjust the frequency of the surface acoustic wave device.

20. The method according to claim 19, wherein said at least one first film is disposed so as to cover said at least one one-terminal-pair surface-acoustic-wave resonator that is connected in series to said surface acoustic wave filter, and the anti-resonant frequency of said at least one one-terminal-pair surface-acoustic-wave resonator is located in an attenuation zone at the higher side of the passband of said surface acoustic wave filter.

21. The method according to claim 19, wherein said at least one first film is disposed so as to cover said at least one one-terminal-pair surface-acoustic-wave resonator that is connected in parallel to said surface acoustic wave filter, and the resonant frequency of said at least one one-terminal-pair surface-acoustic-wave resonator is located in an attenuation zone at the lower side of the passband of said surface acoustic wave filter.

22. The method according to claim 19, wherein said at least one first film is disposed so as to cover at least one one-terminal-pair surface-acoustic-wave resonator that is connected in series to said surface acoustic wave filter, and the anti-resonant frequency of said one-terminal-pair surface-acoustic-wave resonator is located in an attenuation zone at the higher side of the passband of said surface acoustic wave filter, and wherein said film is disposed so as to cover at least one one-terminal-pair surface-acoustic-wave resonator that is connected in parallel to said surface acoustic wave filter, and the resonant frequency of said one-terminal-pair surface-acoustic-wave resonator that is connected in parallel to said surface acoustic wave filter is located in an attenuation zone at the lower side of the passband of said surface acoustic wave filter.

* * * * *